United States Patent
Fathi et al.

(10) Patent No.: US 11,636,671 B1
(45) Date of Patent: Apr. 25, 2023

(54) IMAGE ACQUISITION PLANNING SYSTEMS AND METHODS USED TO GENERATE INFORMATION FOR STRUCTURES OF INTEREST

(71) Applicant: Pointivo, Inc., Atlanta, GA (US)

(72) Inventors: Habib Fathi, Atlanta, GA (US); Daniel Ciprari, Atlanta, GA (US); William Wilkins, Suwanee, GA (US)

(73) Assignee: POINTIVO, INC., Atlanta, GA (US)

( * ) Notice: Subject to any disclaimer, the term of this patent is extended or adjusted under 35 U.S.C. 154(b) by 0 days.

(21) Appl. No.: 17/411,392

(22) Filed: Aug. 25, 2021

Related U.S. Application Data

(63) Continuation of application No. 16/440,735, filed on Jun. 13, 2019, now Pat. No. 11,106,911.

(60) Provisional application No. 62/684,273, filed on Jun. 13, 2018.

(51) Int. Cl.
| | | |
|---|---|---|
| *G06K 9/00* | (2022.01) | |
| *G06V 20/10* | (2022.01) | |
| *B64C 39/02* | (2023.01) | |
| *G06F 30/23* | (2020.01) | |

(52) U.S. Cl.
CPC .......... *G06V 20/176* (2022.01); *B64C 39/024* (2013.01); *G06F 30/23* (2020.01); *B64C 2201/123* (2013.01); *B64C 2201/126* (2013.01); *B64C 2201/127* (2013.01)

(58) Field of Classification Search
CPC .................................................. G06T 7/593
See application file for complete search history.

(56) References Cited

U.S. PATENT DOCUMENTS

| | | |
|---|---|---|
| 8,346,578 B1 | 1/2013 | Hopkins et al. |
| 8,775,219 B2 | 7/2014 | Swanson et al. |
| 9,070,018 B1 * | 6/2015 | Ciarcia ................. G06V 10/44 |
| 9,129,355 B1 | 9/2015 | Harvey |
| 9,262,564 B2 | 2/2016 | Plummer et al. |
| 9,384,510 B2 | 7/2016 | Battcher et al. |
| 9,508,263 B1 | 11/2016 | Teng et al. |
| 9,524,450 B2 | 12/2016 | Ravindran et al. |
| 9,536,148 B2 | 1/2017 | Gross |
| 9,582,932 B2 | 2/2017 | Merwe et al. |
| 9,613,538 B1 | 4/2017 | Poole et al. |
| 9,618,940 B1 | 4/2017 | Michini et al. |
| 9,679,227 B2 | 6/2017 | Taylor et al. |

(Continued)

*Primary Examiner* — Hadi Akhavannik
(74) *Attorney, Agent, or Firm* — Thomas | Horstemeyer, LLP

(57) ABSTRACT

The present disclosure relates to improvements in systems and methods in acquiring images via imaging devices, where such imaging devices can be configured, in some implementations, with an unmanned aerial vehicle or other vehicle types, as well as being hand-held. Images are acquired from the imaging devices according to capture plans where useful information types about a structure of interest (or objects, items, etc.) can be derived from a structure image acquisition event. Images acquired from capture plans can be evaluated to generate improvements in capture plans for use in subsequent structure image acquisition events. Capture plans provided herein generate accurate information as to all or part of the structure of interest, where accuracy is in relation to the real-life structure incorporated in the acquired images.

22 Claims, 3 Drawing Sheets

(56) References Cited

U.S. PATENT DOCUMENTS

| | | |
|---|---|---|
| 9,682,777 B2 | 6/2017 | Tofte et al. |
| 9,734,397 B1 | 8/2017 | Larson et al. |
| 9,740,200 B2 | 8/2017 | Bethke et al. |
| 9,805,261 B1 | 10/2017 | Loveland et al. |
| 9,823,658 B1 | 11/2017 | Loveland et al. |
| 9,846,915 B2 | 12/2017 | Howe et al. |
| 10,012,735 B1 | 7/2018 | Loveland et al. |
| 10,037,463 B2 | 7/2018 | Schultz et al. |
| 10,037,464 B2 | 7/2018 | Schultz et al. |
| 10,157,314 B2 | 12/2018 | Li et al. |
| 10,217,207 B2 | 2/2019 | Marra et al. |
| 10,364,027 B2 | 7/2019 | Loveland et al. |
| 2014/0125667 A1 | 5/2014 | Praun et al. |
| 2014/0278697 A1* | 9/2014 | Thornberry ........ G06Q 10/0631 705/7.23 |
| 2015/0149454 A1* | 5/2015 | Hieronymus ......... G06F 16/583 707/728 |
| 2015/0302529 A1 | 10/2015 | Jagannathan |
| 2015/0363645 A1* | 12/2015 | Chen ........................ G06T 7/50 382/173 |
| 2016/0352099 A1 | 12/2016 | Bourgeau |
| 2017/0206648 A1* | 7/2017 | Marra .................... G01C 11/00 |
| 2017/0236024 A1 | 8/2017 | Wang et al. |
| 2017/0270612 A1* | 9/2017 | Howe ................ G06Q 30/0278 |
| 2017/0352100 A1* | 12/2017 | Shreve ................... G06V 20/10 |
| 2018/0247416 A1 | 8/2018 | Ruda et al. |
| 2018/0330528 A1 | 11/2018 | Loveland et al. |
| 2019/0118945 A1 | 4/2019 | Loveland et al. |
| 2019/0147749 A1 | 5/2019 | Lewis et al. |

\* cited by examiner

IMAGE ACQUISITION PLANNING SYSTEMS AND METHODS USED TO GENERATE INFORMATION FOR STRUCTURES OF INTEREST

This application is a continuation claiming priority to, and the benefit of, U.S. Non-Provisional application Ser. No. 16/440,735, filed Jun. 13, 2019, which claims priority to U.S. Provisional Application No. 62/684,273, filed Jun. 13, 2018, both of which are hereby incorporated by reference in their entireties.

STATEMENT OF GOVERNMENT INTEREST

This invention was made with government support under contract number 1519971 an 1632248 awarded by the National Science Foundation. The Government has certain rights to the invention.

FIELD OF THE DISCLOSURE

The present disclosure relates to improvements in systems and methods in acquiring images via imaging devices, where such imaging devices can be configured, in some implementations, with an unmanned aerial vehicle or other vehicle types, as well as being hand-held. Images are acquired from the imaging devices according to capture plans where useful information types about a structure of interest (or objects, items, etc.) can be derived from a structure image acquisition event. Images acquired from capture plans can be evaluated to generate improvements in capture plans for use in subsequent structure image acquisition events. Capture plans provided herein generate accurate information as to all or part of the structure of interest, where accuracy is in relation to the real-life structure incorporated in the acquired images.

BACKGROUND OF THE DISCLOSURE

Generation of useful information about structures in a scene or other objects, items, etc. is a significant area of investigation in computer vision research today. With regard to structures specifically, it can be desirable to image structures to obtain useful information related to the structure, such as 3D reconstructions, 3D digital representation, inspection results, measurements, construction estimates, and insurance underwriting and adjustment, among many others. As would be appreciated, the usefulness of information obtained about structures of interest can be substantially enhanced when the information type derived therefrom is accurate, for example quantitatively or qualitatively accurate, in relation to all or part of the structure.

One significant application for imaging of structures is acquisition of images of a structure via an unmanned aerial vehicle, also called a "drone," that is equipped with at least one imaging device. One example of such an application is the generation of images of a roof via an unmanned aerial vehicle from which relevant information about the roof and parts of a roof, as well as the surrounding structures and areas that might be of interest. This roof information can be included in a roofing report, such as disclosed in U.S. Pat. No. 8,670,961, the disclosure of which is incorporated herein in its entirety by this reference.

To successfully generate images from which useful structure information can be derived, the unmanned aerial vehicle must be navigated to the location where the structure of interest is, navigate through and around the structure, as well as the scene, to acquire a set of images from which the desired information about the structure, for example, a roof, can be generated, followed by navigation of the unmanned aerial vehicle back to a site. Such navigation can be accomplished using a flight plan, also referred to herein as a "capture plan," that controls navigation and operation of the unmanned aerial vehicle during a structure image acquisition event.

One such flight plan generation methodology is disclosed in U.S. Pat. No. 9,612,598, the disclosure of which is incorporated herein in its entirety by this reference. The '598 patent describes methods for generating a flight plan and communicating it to the UAV. The disclosed methodology includes factors relevant to the UAV flight that are provided by the user or the system. Factors that can be relevant to the flight plan can include the structure footprint, structure height, and geographic location. These flight plan-related factors are all identified and incorporated into the flight plan prior to the commencement of the UAV flight. Accordingly, there is no provision of feedback (other than potentially obstacle detection) during the flight, nor is analysis of the results performed after the flight to determine the effectiveness of the flight plan. Other capture plan frameworks for generating images from which roof information can be generated are disclosed in U.S. Pat. Nos. 9,805,261, 9,805, 261, 10,012,735 and US Patent Publication Nos. US2019/0118945, US2019/0042829, the disclosures of which are incorporated herein in their entireties. These latter cited patent documents also do not appear to incorporate at least variations of feedback during or after image processing to provide analysis of the nature and quality of the images acquired during the structure image acquisition event, nor do they address improvements in subsequent capture plans as a direct or indirect result of such acquired image analysis.

It is known that a flight pattern of an unmanned aerial vehicle can influence the quality of image acquisition during a unmanned aerial vehicle flight. For example, inaccurate centering of unmanned aerial vehicle angle to the structure on orbit or an incomplete grid pattern can generate less dense point clouds that can limit the completeness of information derivable therefrom. Inconsistent flight speed can result in low image overlap, especially on turns. Operation of the unmanned aerial vehicle at too fast a speed can result in poor overlap and blurring, which can also negatively affect the quality of information derivable from the images. Flying too high or too low or incomplete flight patterns can also result in less than optimum image information.

Problems associated with navigation and operation of a unmanned aerial vehicle during the acquisition of images of a structure from which useful information is intended to be obtained can result in the desired goal for the image acquisition—that is the reason for which the imaging is being conducted in the first place—not being met in a structure image acquisition event. For example, some of the acquired images can include occlusions that can reduce the quality of a 3D reconstruction of the structure from image processing. Moreover, the acquired images may be good for one type of use, such as providing inspection-level information, but the images may be totally useless for another use, such as to provide accurate measurements for the structure. Because the acquired images may be only be processed after the image acquisition event is completed, it may not be known that the images obtained of the structure will be unfit for the intended purpose until well after the image acquisition event is completed.

Currently, a solution for such unsatisfactory image acquisition is to recommend that a second image acquisition event be conducted to generate improved images. This not only adds to the cost to generate information about a structure such as a roof from imaging information, delays can result in a contractor not gaining a construction job or a homeowner waiting a long time for an insurance adjustment on her damaged roof. It is also possible that access to the site where the structure is located can only be obtained once, which means that a failed image acquisition event can prevent the acquisition of any information about the structure. Moreover, to date, methods to improve capture plans by analysis of images have been ad hoc in nature, in that a subsequent structure image acquisition event is conducted to generate images that are better than the images captured in the first image acquisition event, without also developing a systematic approach to generating images that are, in fact, better in a subsequent image acquisition event.

Aspects not directly related to image acquisition via the unmanned aerial vehicle can also affect the ability to obtain the desired level of structure information. For example, the image sensor may be dirty or the unmanned aerial vehicle may acquire images when the environment is too dark. The sensor may not have the appropriate resolution to acquire images of the desired level of information: a low resolution sensor is unlikely to provide very accurate measurements of a structure because the level of necessary detail will not be obtainable from the image information. According to current state of the art, the impacts of such problems will typically not be discernible until after the images are processed. The desired goal for the image acquisition event may therefore not be obtainable.

While unmanned aerial vehicles are a well-recognized way today to generate images of structures, images can also be generated by a person moving an imaging device around a structure, object, item etc., or by movement of a non-aerial vehicle equipped with an imaging device through a scene. The success of such image acquisition events is also greatly influenced by the manner in which the images of the structure, etc. of interest are acquired, as well as the characteristics of the imaging devices themselves.

There remains a need for improvements in image acquisition plans from which desired information about a structure or object of interest can be derived in accordance with a desired capture plan goal or target. The present disclosure provides this and other improvements.

SUMMARY OF THE DISCLOSURE

The present disclosure provides improvements in capture plans that can be generated from after-the-fact analyses of derived structure, object, item, etc. information and the acquired images generated in an image acquisition event. In particular, the present disclosure can provide determinations of whether and why or why not that a capture plan goal was or was not achieved from the implemented capture plan. Such analyses can provide knowledge about the characteristics and effectiveness of the capture plan used during one or more image acquisition events in allowing the capture plan goal to be met in another image acquisition event. To this end, knowledge can be applied to generate and implement capture plans in one or more subsequent image acquisition events to improve the nature and quality of structure, item, object, etc. information derivable in that event. Still further, the present disclosure can provide improvements in capture plan generation and implementation while an image acquisition event is underway so as to better ensure that the capture plan goal will be achieved from the image acquisition event before it ends. The present disclosure can also provide predictions of whether a proposed capture plan will allow a capture plan goal to be achieved when implemented in an image acquisition event.

In one aspect, among others, a method comprises defining, by a computer or a user, a capture plan goal for an aerial imaging event, wherein the capture plan goal is configured to provide one or more defined information types about a structure of interest, and wherein the one or more defined information types are generated via aerial imaging of the structure of interest by an unmanned aerial vehicle configured with at least one image capture device; generating, by the computer or the user, a first capture plan configured to substantially complete the capture plan goal, wherein the first capture plan comprises instructions configured for operating of the unmanned aerial vehicle, wherein the instructions are associated with operating the unmanned aerial vehicle and navigating, by the computer or the user, the unmanned aerial vehicle to, around, and back from a location proximate to the structure of interest; acquiring, by the unmanned aerial vehicle, a plurality of images of the structure of interest in a first structure imaging event, wherein the plurality of acquired images are acquired by the unmanned aerial vehicle during the first structure imaging event according to: vehicle operation instructions, vehicle navigation instructions, and image acquisition instructions; and processing, by the computer, the plurality of acquired images to generate information types about the structure of interest, wherein the generated information types comprises at least some of the one or more information types about the structure of interest defined by the capture plan goal. In one or more aspects, the method can further comprise comparing, by the computer or the user, each of the generated information types with the one or more defined information types defined by the capture plan goal; and/or determining, by the computer or the user, whether some or all of the generated information types substantially align with each of the one or more information types defined by the capture plan goal.

In various aspects, the one or more defined information types can comprise one or more of: a 3D representation of all or part of the structure of interest, wherein the 3D representation comprises a 3D reconstruction or a point cloud; measurements of all or part of the structure of interest; counts of the structure of interest or parts of the structure of interest; identification of the structure of interest or parts of the structure of interest; orientation of two objects on or near the structure of interest with respect to each other in a scene in which the structure of interest is located; identification of materials incorporated in the structure of interest; and/or characterization of a condition state for the structure of interest or parts of the structure of interest. The first capture plan can incorporate information comprising at least some of: information about the structure of interest known prior to the image acquisition, wherein the known structure information comprises one or more of: estimated dimensions of all or part of the structure of interest, GPS location of the structure of interest, estimated height of the structure of interest, estimated outer boundaries of the structure of interest, and obstacles proximate to the structure of interest; unmanned aerial vehicle and image capture device information comprising one or more of: image capture device lens resolution, unmanned aerial vehicle battery life, inertial measurement sensors and associated componentry, unmanned aerial vehicle GPS status or interference during the image acquisition, altitude of the unmanned aerial vehicle during the image acquisition, temperature data, and unmanned aerial vehicle clock data; number of images to be acquired during the first structure imaging event; number of images to be acquired per unit time during the first structure imaging event; number of images to be acquired per unit of distance traveled by the unmanned aerial vehicle during the first structure imaging event; distances between the unmanned aerial vehicle and all or part of the structure of interest during the image acquisition; view angle derivable from an acquired image of the structure of interest or structure part and a corresponding surface or surface part; angle of triangulation derivable from each of two points in two images of the same structure of interest or structure part; structure sample distance ("SSD") between the unmanned aerial vehicle and the structure of interest or structure part during the image acquisition; ground sample distance ("GSD") between the unmanned aerial vehicle and the structure of interest or structure part during the image acquisition; speed at which the unmanned aerial vehicle is to be moving in the scene or environment during the image acquisition; and/or number of passes to be made by the unmanned aerial vehicle in and around the structure of interest or parts of the structure during the image acquisition.

In some aspects, the method can further comprise generating information about: resolution of the plurality of acquired images; presence or absence of occlusions in the plurality of acquired images; potential error range of information derived from the plurality of acquired images; information associated with weather and illumination around the structure of interest during the image acquisition; orientation of the imaging device with respect to sunlight direction during the image acquisition; unmanned aerial vehicle gimbal position and stability during image acquisition; obstructions proximate to the structure of interest during the image acquisition; and/or acquired image characteristics associated with navigation of the unmanned aerial vehicle, wherein the acquired image characteristics result at least in part from operation of the unmanned aerial vehicle according to the first capture plan. The unmanned aerial vehicle operations can comprise one or more of: the degree of alignment of the unmanned aerial vehicle with the all or part of the structure of interest during the image acquisition; the degree of overlap between the acquired images incorporating an interior of the structure of interest and images incorporating one or more boundaries of the structure of interest; the degree of centering of the unmanned aerial vehicle relative to the structure of interest during the image acquisition; degree of forward and side overlap between the acquired images when the first capture plan is configured to acquire images in a grid pattern relative to the structure of interest; degree of overlap of image radii between acquired images when the first capture plan is configured to acquire images in a circular pattern relative to the structure of interest; yaw of the unmanned aerial vehicle during the image acquisition; and/or orientation of the at least one image capture device relative to the structure of interest during the image acquisition.

In one or more aspects, the one or more defined information types can comprise one or more measurements of the structure of interest, and generated roof dimensions can be within about 5% of actual roof dimensions when the actual roof dimensions are directly measured. If one or more of the generated information types do not substantially conform to the one or more defined information types defined by the capture plan goal, the method can further comprise generating a second capture plan incorporating information derived from processing of the plurality of acquired images from the first structure imaging event, wherein the second capture plan is used in a second structure imaging event. A structure of interest in the second imaging event can be the same as the structure of interest in the first imaging event, or can be different from the structure of interest in the first imaging event.

In various aspects, the method can further comprise generating feedback about whether all or part of the capture plan goal has been achieved in the first structure imaging event, wherein the feedback is provided to the computer or to the user, and wherein the feedback is optionally used in the generation of a second capture plan. The feedback can comprise information about one or more of the following: view angle derivable from an acquired image of the structure of interest or structure part and a corresponding surface or surface part; angle of triangulation derivable from each of two points in two images of the same structure of interest or structure part; ground sample distance ("GSD") between the unmanned aerial vehicle and the structure of interest or structure part during the image acquisition; and/or structure sample distance ("SSD") derivable for the unmanned aerial vehicle and the structure of interest or part during the image acquisition. The 3D reconstruction can be generated. The 3D reconstruction can incorporate all or part of the structure of interest, Information associated with the 3D reconstruction can be provided, wherein the provided information comprises one or more of: point cloud density when the 3D reconstruction comprises a point cloud; re-projection error measurement for the 3D reconstruction; and/or accuracy indication for the 3D reconstruction, wherein the accuracy indication is provided in the form of a probability or percentage that the 3D reconstruction is an accurate representation of all or part of the structure.

In some aspects, the 3D reconstruction can comprise a wireframe, wherein the wireframe can comprise all or part of the structure of interest. The method can further comprise evaluating the wireframe to identify missing or occluded areas; and/or analyzing the plurality of acquired images from which the wireframe was derived to provide information associated with a diagnosis of one or more reasons for the presence of the missing or occluded areas. The method can further comprise incorporating the provided information associated with the diagnosis in a second capture plan. Instructions can be optionally provided for imaging of at least part of the structure of interest from ground-level. At least some of the image processing can be conducted during the first structure imaging event, and/or at least some feedback can be incorporated in the vehicle operation instructions, the vehicle navigation instructions, or the image acquisition instructions, thereby allowing modification of at least some of the first capture plan during the first structure imaging event.

In another aspect, a method comprises defining, by a computer or a user, a capture plan goal for an aerial imaging event, wherein the capture plan goal is configured to provide one or more defined information types about a structure of interest, and wherein the one or more defined information types are generated via aerial imaging of the structure of interest by an unmanned aerial vehicle configured with at least one image capture device; generating, by the computer or the user, a first capture plan configured to substantially complete the capture plan goal, wherein the first capture plan comprises instructions configured for operating of the unmanned aerial vehicle, wherein the instructions are associated with operating the unmanned aerial vehicle and navigating, by the computer or the user, the unmanned aerial vehicle to, around, and back from a location proximate to the structure of interest; acquiring, by the unmanned aerial vehicle, a plurality of images of the structure of interest in a first structure imaging event, wherein the images are acquired by the unmanned aerial vehicle during the first structure imaging event according to: vehicle operation instructions, vehicle navigation instructions, and/or image acquisition instructions; processing, by the computer, the plurality of acquired images to generate information types about the structure of interest, wherein the generated information types comprises at least some of the one or more defined information types about the structure of interest defined by the capture plan goal; generating a second capture plan for use in a second structure imaging event, wherein: the structure of interest imaged in the first structure imaging event and a structure of interest imaged in the second structure imaging event are the same or different, and/or an output of each of the first and second structure imaging events is a 3D reconstruction of the structure of interest imaged in the first or the second structure imaging event; and/or comparing each of a first 3D reconstruction generated from the first structure imaging event and a second 3D reconstruction generated from the second structure imaging event with information associated with an associated real-life structure, thereby providing accuracy information associated with the first and second capture plans. The accuracy information associated with the first and second capture plans can incorporate measurement information providing a percent error or confidence level that the first and second 3D reconstructions have the same features or dimensions as the associated real-life structure. The accuracy information associated with the first and second capture plans can be incorporated into a capture plan used in subsequent structure imaging events.

Additional advantages of the invention will be set forth in part in the description that follows, and in part will be apparent from the description, or may be learned by practice of the invention. The advantages of the invention will be realized and attained by means of the elements and combination particularly pointed out in the appended claims. It is to be understood that both the foregoing general description and the following detailed description are exemplary and explanatory only and are not restrictive of the invention, as claimed.

DETAILED DESCRIPTION OF THE DISCLOSURE

Figure 1:
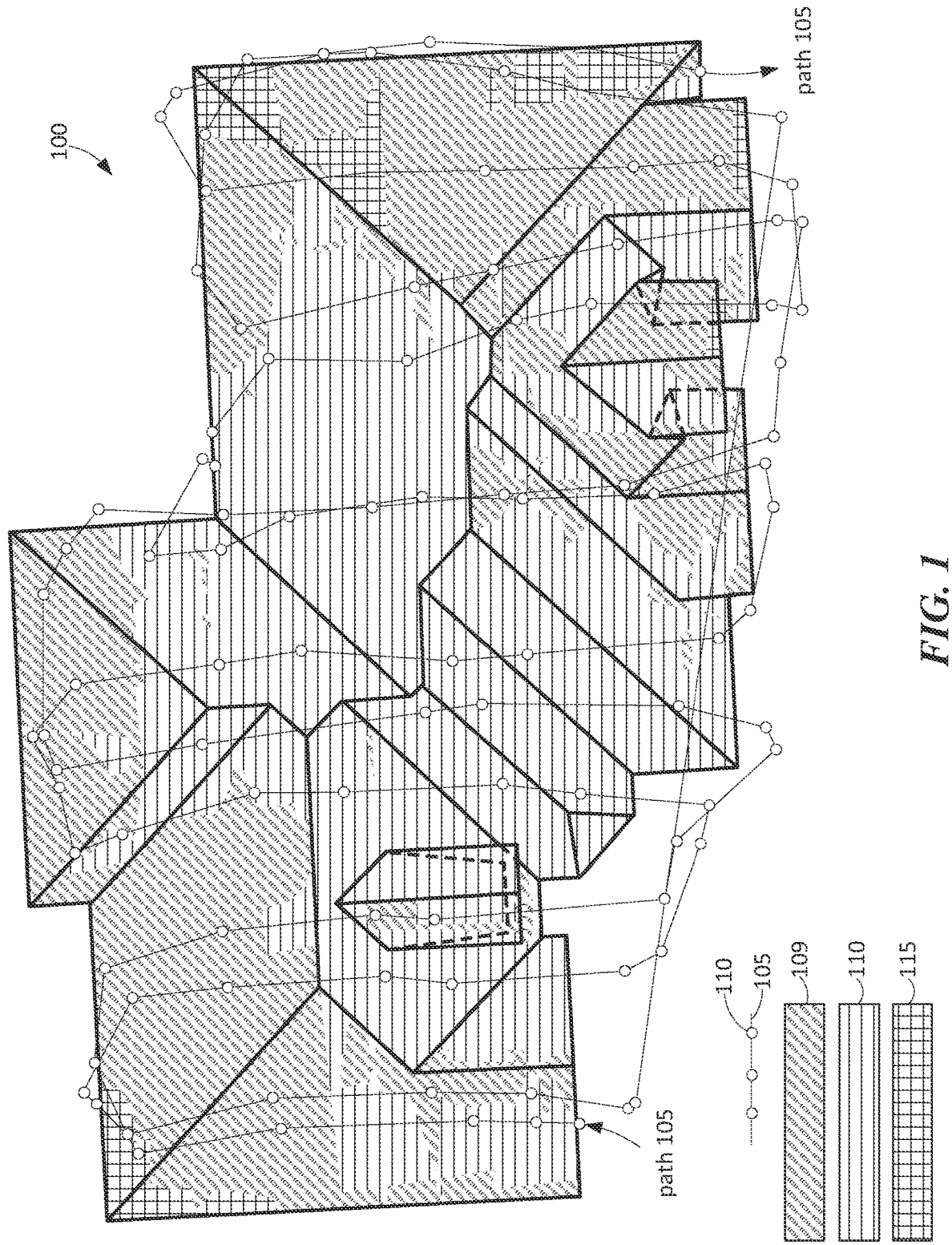
FIG. 1 illustrates an implementation of the present disclosure relating to generated results of a capture plan, in accordance with various aspects of the present disclosure.

The term "substantially" is meant to permit deviations from the descriptive term that do not negatively impact the intended purpose. All descriptive terms used herein are implicitly understood to be modified by the word "substantially," even if the descriptive term is not explicitly modified by the word "substantially.

The term "about" is meant to account for variations due to experimental error. All measurements or numbers are implicitly understood to be modified by the word about, even if the measurement or number is not explicitly modified by the word about.

An "image acquisition event" is a period in which a plurality of images, where a plurality comprises two or more images, that include all or part of a structure of interest is acquired for processing and analysis according to the methodology herein. An image acquisition event has a beginning, an operational period, and an end.

"Acquired images" means a plurality of images that are acquired during an image acquisition event, wherein at least some of the plurality incorporates image information about at least part of the structure of interest. The acquired images are generated from one or more imaging devices in a format that can be processed according to the methodology of the present disclosure as set out in more detail hereinafter. In some implementations, the images are acquired by an aerial vehicle where the imaging device from which the images are acquired can be incorporated in the vehicle and be operational therewith. Such an example of an imaging device incorporated with an aerial vehicle is an "unmanned aerial vehicle." An imaging device can also be operational with other vehicle types, such as automobiles, etc.

A "capture plan goal" is a goal or target for the image acquisition event or, put another way, information types or collection of information types that are intended to be generated as a result of processing of the acquired images generated during the image acquisition event. When in the context of generating one or more information types from a structure of interest, such defined capture plan goals can include one or more of:

Generation of a 3D representation of all or part of a structure of interest, such as a 3D reconstruction or a point cloud, wherein additional information can be derived from the reconstruction. A 3D reconstruction of all or part of the structure of interest can be provided in the form of, for example, a mesh, orthomosaic image, a wireframe;

Generation of measurements of all or part of a structure of interest. The measurements can have a level of accuracy as described hereinafter;

Counts or numbers of a structure of interest or parts of thereof (e.g., an entire roof, or the numbers of different planes in the roof);

Condition state (e.g, new, old, damage, type of damage, color);

Inspection-level detail of all or part of a structure of interest;

Identification of a structure type or parts of a structure of interest;

Orientation of two objects with respect to each other (i.e., topology);

Surveillance and/or situational awareness of a scene or one or more objects, people, or animals of interest in a scene;

Counts of one or more people or animals of interest in a scene;

Identification of one or more people or animals of interest in a scene;

Comparison between images acquired of a scene or location in a first image acquisition event and images acquired of the same scene or location during a second image acquisition event, for example, to show changes in the scene or changes in structures in the scene over time;

Efficient image acquisition and image processing parameters (e.g., image acquisition quantity and quality characteristics vs. the time to transfer such images and the associated processing time required);

Successful navigation of an imaging device through an environment;

Visualization of an environment or structures, objects, people, animals, etc. in which the imaging device is traveling;

Use of information derived from acquired images in augmented reality (A/R) and virtual reality (V/R) applications; and Use of information derived from acquired images in Building Information Modeling (BIM) applications.

Applications such as topology, object identification, AR/VR applications, BIM applications, among others, are disclosed in U.S. Pat. No. 9,904,867, the disclosure of which is incorporated in its entirety by this reference.

In accordance with the systems and methods disclosed herein, a first structure image acquisition event may provide information suitable to meet a first capture plan goal but may not for another capture plan goal. For example, acquired images that are suitable to meet a goal of inspection-level detail may not include the necessary detail to allow accurate measurements of the structure to be obtained, as is discussed further herein. A first capture plan goal can therefore be generated to define at least one specific target or goal for a type or types of information to be derived from the first structure image acquisition event. A first capture plan can be defined to generate acquired images that can be processed to derive information relevant to achieving the capture plan goal, for example, inspection-level detail or measurement-level detail. The first capture plan goal and/or the associated capture plan can be analyzed according to the methodology herein to provide information to indicate whether the capture plan goal, that is, the goal(s) or target(s) desired or intended from the image acquisition event, have been met.

A "capture plan" for image acquisition by a vehicle, can include instructions for vehicle navigation, vehicle operation, and image acquisition in an around the scene or structure of interest during generation of acquired images in a structure image acquisition event. In one implementation, a capture plan suitable for use herein can incorporate instructions associated with generation of the acquired images by at least one imaging device during the image acquisition event by an unmanned aerial vehicle. The plurality of acquired images are suitable for processing to derive information, for example, in the form of one or more information types, about all or part of the structure of interest being imaged. In non-limiting examples, the capture plan can be associated with at least some of:

Number of images to be acquired during an image acquisition event;

Number of images per unit time (e.g., frames per second);

Number of images per unit of distance traveled by the imaging device (e.g., number of images acquired per 100 ft of distance);

Distances (for example, altitude or linear distance) from the structure or part of the structure from which each of the images are acquired;

View angle between the imaging device and the structure or structure part being imaged;

Speed at which the imaging device is moving in the scene or environment where the structure of interest is located;

Number of passes made in and around structure during image acquisition;

Information about the structure or scene being imaged where such information can be identified before the image acquisition event (e.g., approximate dimensions of the structure, GPS location, structures or obstacles that must be avoided or accounted for during image acquisition etc.);

Imaging device information (e.g., lens resolution, battery life, sensor information that can allow relevant data to be recorded or adjusted during image acquisition etc.);

Structure sample distance (SSD), as such term is defined hereinafter;

Duration of image acquisition;

Structure height and structure boundaries;

Image resolution;

Time of day (TOD) of image acquisition;

GPS status or interference or potential error range during the structure image acquisition event;

Weather and illumination during the structure image acquisition event;

Orientation of the image acquisition device with respect to sunlight direction during the image acquisition event;

Gimbal stability of a vehicle during image acquisition;

Occlusion and obstruction that affects image acquisition;

Capture pattern/navigation of the vehicle to structure of interest matching, capture pattern/navigation of the vehicle boundary overlap, pattern/navigation of the vehicle centering relative to the structure;

Forward and side overlap for capture plan provided in a grid pattern and radius overlap for capture plan provided in an orbit pattern;

Yaw of vehicle on turning during image acquisition; and

Image/sensor orientation during image acquisition.

"Structure Sample Distance" ("SSD") for a given surface is defined as the distance between pixel centers measured on that surface and is function of camera distance to the surface and focal length of the camera. Without being bound by theory, the inventors herein currently understand that SSD and occlusion can operate as previously unrecognized factors in acquiring images of a structure that are suitable to generate a desired level of detail so as to provide the intended information about the structure as set forth elsewhere herein. Further, multiple semantic data points can be pertinent to generating the requisite information needed for inspection level detail for some structures of interest, such as color variations and surface characteristics (e.g., imperfections, damage, etc.), that may only be resolvable/identifiable from high resolution imagery, where "resolution" refers to the distance of the camera to a target surface divided by the focal length of the camera in pixels.

"Ground sample distance" ("GSD") in a digital photo of the ground from air or space is the distance between pixel centers measured on the ground. For example, in an image with a one-meter GSD, adjacent pixels image locations are 1 meter apart on the ground. In the context of the present disclosure, GSD can relate to the distance between the unmanned aerial vehicle and the ground when the subject image is acquired. In some aspects, GSD can be useful to derive a height for a structure of interest from images acquired therefrom.

In a first implementation, at least one image acquisition device can be configured to generate acquired images of a structure of interest in the scene, where such acquired images are generated by implementation or operation of a first capture plan. This capture plan can be configured to provide instructions associated with navigating and operating an image acquisition device through and around a scene or environment that includes a structure of interest so as to generate acquired images that incorporate information or information types about all or part of a structure of interest.

Such acquired images can be processed to derive structure information therefrom, where the nature and quality of such structure information can be evaluated against a capture plan goal generated for that first image acquisition event. Such derived structure information and capture plans associated therewith are discussed in more detail hereinafter.

In contrast to the UAV flight plan and output methodology described in U.S. Pat. No. 9,612,598, previously incorporated by reference, the present disclosure does not only address generation of structure information or damage reports from an image acquisition event. Rather, the inventive system and methods herein are configurable to generate flight plans—or more generally, capture plans—that can be associated with a plurality of defined capture plan goals. In this regard, inventive capture plan generation and implementations can allow a user to have a purpose or goal for the flight plan of a roof report, as in the '598 patent. Significantly, however, the inventive methodology can also allow generation and implementation of capture plans that are configurable to allow one or more additional capture plan goals to be achieved in an image acquisition event, as discussed elsewhere herein.

In broad constructs, the present disclosure provides improvements in capture plans that can be generated from after-the-fact analyses of derived structure information and the acquired images generated from which the structure information is derived in a structure image acquisition event. In particular, the present disclosure can provide determinations of whether and why (or why not) a capture plan goal was or was not achieved from the implemented capture plan. Such analyses can provide knowledge about the characteristics and effectiveness of the first capture plan used during one or more image acquisition events in allowing the capture plan goal to be met in a subsequent image acquisition event. To this end, knowledge gained from a first capture plan implementation can be deployed to generate and implement capture plans in one or more subsequent image acquisition events to improve the nature and quality of structure information derivable in that event. Still further, the present disclosure can provide improvements in capture plan generation and implementation while a structure image acquisition event is underway so as to better ensure that the capture plan goal will be achieved from the image acquisition event before it is completed. The present disclosure can also provide predictions of whether a proposed capture plan will allow a capture plan goal to be achieved when implemented in an image acquisition event. These and other aspects of the present disclosure will be discussed hereinafter.

The imaging devices used to generate the acquired images can comprise, but are not limited to, digital cameras, smartphone cameras, tablet cameras, wearable cameras, video cameras, digital sensors, charge-coupled devices, and/or the like. LIDAR, depth sensing cameras, and thermal imaging can also be used. The imaging devices can include known or determinable characteristics including, but not limited to, focal length, sensor size, aspect ratio, radial and other distortion terms, principal point offset, pixel pitch, alignment, and/or the like. Information associated with such determinable characteristics can be incorporated into acquired image metadata for use in the information derivable therefrom. As discussed elsewhere herein, the imaging devices can be integrated in or operational with aerial vehicles, both manned and unmanned, or other types of vehicles. In further implementations, hand-held imaging devices may be appropriate.

Imaging of a scene and all or part of a structure of interest (or object, or item, etc.) therein can be commenced when the at least one imaging device is present at the scene where the structure(s) of interest is located. A plurality of images for processing to generate useful information can be acquired by movement of the imaging device through and around and up and down around the scene or environment in the proximity of the structure(s) interest in a manner to provide suitably overlapping images of a quantity and quality to allow acquired images from which useful information can be derived. Such image acquisition can be in accordance with one or more capture plans as discussed herein.

Information relevant to image acquisition can include, for example, information about the address of the structure, geographic location of the structure (e.g., X, Y, Z coordinates, latitude/longitude coordinates), GPS location, identity of the structure, owner or supplier of the information order (e.g., contractor, insurance company etc.), time of operation, vehicle speed during travel, weather conditions during operation, material type, and other information that could be relevant to the quality, content, and use cases for the acquired images, as well as any information derivable therefrom.

In one implementation, the imaging device can be moved through and around a scene or environment, for example, in the air or on or near ground level, to allow acquired images to be generated of structures etc. from locations above the ground. Such images can be acquired, for example, from unmanned aerial vehicles ("UAVs"), where such UAVs can comprise unmanned aerial vehicles, satellites, weather balloons, or the like. As would be recognized, the UAV may include one or more imaging devices configured to acquire images of a scene or environment, and any structures (or objects, people, animals, etc.) of interest in the scene. The imaging device can be appropriately positioned on the aircraft to allow suitable images to be generated from an aerial flight. Typically, the UAV will include navigational and operational components such as one or more global positioning system (GPS) receivers, one or more communications systems to send and receive information pertinent to the flight, image acquisition etc., one or more inertial measurement units (IMU) and related componentry (e.g., clock, gyroscope, compass, altimeters) so that the position and orientation of the unmanned aircraft can be monitored, remotely directed, recorded and/or stored with and/or correlated with particular acquired images. An unmanned aircraft can incorporate temperature sensing equipment, recording equipment, etc. An exemplary unmanned aerial vehicle in the form of a unmanned aerial vehicle that includes an onboard imaging device is the DJI Phantom® 4 Pro.

In a specific, non-limiting, example, acquired images that include all or part of a structure of interest can be generated by navigating and operating an unmanned aerial vehicle through and around a scene, where navigation, operational, and image acquisition instructions for the vehicle are associated with capture plan instructions generated for a structure image acquisition event.

An unmanned aerial vehicle capture plan can be implemented wholly or partly by a human operator who provides navigational, operational, and image acquisition instructions to the aerial vehicle during an image acquisition event, where such human operator-generated instructions can be transmitted to and from a remote location where the operator is stationed or at the site where the structure is located. When a human is fully or partially involved in completion of the capture plan, he can be assisted via the providing of visual, audible, or haptic signals that can suitably prompt him to modify the vehicle path during a flight.

The navigation, operation, and image acquisition associated with a unmanned aerial vehicle capture plan can also be generated wholly automatically to allow autonomous operation thereof. Instructions for implementation of the capture plan to allow the vehicle to fly through and around a scene or environment to generate the acquired images without intervention by a human operated autonomously can be provided to the unmanned aerial vehicle (or other vehicle type) via transmission of instructions associated with the capture plan to the vehicle from a remote device, or via instructions loaded onto hardware associated with the vehicle prior to start of the image acquisition event.

Still further, one or more of the navigation, operation, and image acquisition can be conducted both autonomously and via human operation. During an autonomous operation of the unmanned aerial vehicle, a human operator can monitor execution of the capture plan visually via images or video that are remotely transmitted to the operator via the onboard image acquisition device or from flight path information that can be shown on his monitor. If the human operator observes that the unmanned aerial vehicle may need manual intervention, for example, to avoid an obstacle or to deal with a weather event or better position for inspection based on current scene information, the operator can override autonomous mode and take over operation of the vehicle. Instructions associated with directing the unmanned aerial vehicle to implement a capture plan can be provided to the operator to allow generation of the acquired images in accordance with the capture plan. If human intervention is indicated, information associated therewith can be incorporated in capture plan goal analysis for subsequent use, as discussed further herein.

Acquired images from which structure information can be derived can also be generated from manned aerial vehicles, such as helicopters, airplanes, and hot air balloons, or the like. A capture plan can be implemented by the allowing the pilot to self-direct operation and navigation of the aerial vehicle. Still further, a capture plan can be implemented by providing the pilot with operational and navigational instructions that direct him to implement the capture plan. Such instructions can be visual, audible, haptic, or a combination thereof. Alternatively, instructions can be provided that enable, in all or in part, automatic operation of the aircraft.

Captures taken from space outside of the earth's atmosphere, can be taken by satellites, or manned and unmanned vehicles. Capture plans for such implementations can be implemented autonomously if the vehicle is unmanned or one or more of autonomously or pilot-directed if the vehicle is manned.

Acquired images from which structure information can be derived can be generated from at or near ground level. For example, an imaging device can be held by a person or placed onboard a vehicle, and the person or vehicle can move through and around a scene or environment according to instructions associated with a capture plan in order to generate the acquired images for processing according to the methodology herein. If a person is holding the imaging device at or near ground level to generate the acquired images, audible, visual, or haptic instructions can be provided to the person to assist in implementing the capture plan. If the imaging device is being moved around the scene or in an environment at or near ground level by a vehicle (e.g., a car, truck, etc.) the vehicle can be in communication with a remote device that can suitably transmit operational and navigational instructions to a driver of the vehicle or to the vehicle itself to implement the capture plan.

A capture plan can also be self-directed by a person holding an imaging device during generation of the acquired images or when the person is operating a vehicle (e.g., unmanned aerial vehicle, UAV, car, etc.) unassisted by computer implemented navigational controls. Information about self-directed capture plans can be analyzed in accordance with the present disclosure.

Still further, acquired images can be generated from underground or underwater scenes or environments via operation of a suitable vehicle or device that can be manned or unmanned. The imaging device associated with such vehicle can be moved in and around the scene or environment according to a capture plan that provides navigation and image acquisition instructions to the vehicle and the imaging device associated therewith.

In broad implementations, the present disclosure relates to automatic, or substantially automatic, analysis of structure information derived from acquired images via image processing of a plurality of images, where such acquired images are generated from digital imagery of a scene having one or more structures of interest therein. The capture plan used to generate the images can be evaluated after the imaging information is complete to determine why a capture plan goal may not have been achieved, among other things. In some implementations, the capture plan can be effectively evaluated while the images are being acquired.

The methods and systems of the present disclosure can be configured to generate and provide feedback about how well (or not well) one or more structure information types derived from images acquired from implementation of a capture plan match or align with at least one defined capture plan goal. Conformity to or alignment with the capture plan goal for the structure information type(s) derived from the acquired images is the purpose for which the image acquisition event was undertaken in the first place. As such, the inventors herein have determined that it is not enough to acquire images of a structure of interest in an image acquisition event and deriving structure information therefrom, that information must be useful for its intended, or defined, purpose.

In some implementations, a capture plan goal can comprise or be associated with the generation of one or more accurate 3D reconstructions of a scene or all or part of one or more structures of interest in the scene, and subsequent structural and/or semantic analysis thereof.

The capture plan goal analysis systems and methods of the present disclosure can have utility in at least four scenarios or use cases:
 analysis of a capture plan after-the-fact;
 use of such analysis to generate and implement an improved capture plan for a subsequent image acquisition event;
 review and correct a capture plan while an image acquisition event is underway; and
 generating predictions of whether a proposed capture plan will be effective to achieve a desired capture plan goal.

Depending on the context in which the disclosed methodology is being used, one or more use cases can be applicable.

In a first use case, the present disclosures can have utility in analysis of a capture plan goal after an image acquisition event is completed wherein acquired images are generated from a capture plan that directs navigation and operation of an imaging device traveling through and among a scene or an environment. In a non-limiting illustration of this use case, after a structure image acquisition event is completed, an analysis can be performed to determine whether and to what extent the structure information types derivable from the acquired images meets or aligns with the capture plan goal for that image acquisition event. Feedback regarding meeting or alignment of the structure information contents derived from the acquired images with the capture plan goal desired from the image acquisition event can be provided. As a non-limiting example, several feedback parameters can be calculated including view angle, angle of triangulation, and Structure-Sample-Distance (SSD):

if extrinsic camera parameters are denoted by C, R, and t where C is camera center, R is camera rotation, and t is camera translation, the view angle to a surface with a normal vector of $\vec{n}$ will be $$\text{camera plane normal } \vec{v} = \text{norm}\left(\begin{bmatrix} R_{20} + t_0 \\ R_{21} + t_1 \\ R_{22} + t_2 \end{bmatrix} - \begin{bmatrix} C_0 \\ C_1 \\ C_2 \end{bmatrix}\right)$$

view angle $\alpha = \cos^{-1}(\vec{n} \cdot \vec{v})$ if calibration matrix for the first camera is denoted by $K_1$ and calibration matrix for the second camera is denoted by $K_2$, the triangulation angle between homogeneous coordinates of two corresponding points ($p_1$ and $p_2$) on the first and second image can be calculated as $p_1{}^n = K_1^{-1} * p_1$ and $p_2{}^n = K_2^{-1} * p_2$ $q_1 = R_1 * p_1{}^n$ and $q_2 = R_2 * p_2{}^n$ triangulation angle $\beta = \cos^{-1}(q_1 \cdot q_2)$ if focal length of a camera in pixels is denoted by f and the distance between the camera center to a 3D point on a given surface is denoted by d $SSD = d/f$ The systems and methods herein can be configured to return qualitative information as feedback related to the degree of which desired or intended structure information type, such as set out in the capture plan goal, was derived from the acquired images that were generated from a capture plan. Still further, the systems and methods can be configured to return quantitative information associated with the correctness or accuracy (or not) of the derived imaging information. In this regard, information can be provided that provides a confidence in an accuracy level for the information obtained. A qualitative measurement can be derived from the processing of the acquired images, whereby such measurement can be denoted as "good" or "bad" or "high confidence" or "low confidence" or "suitable" or "not suitable" other similar denotation. For example, a structure being imaged during an image acquisition event can have an actual height of x feet when measured directly, that is, by hand. Structure information can be derived from the acquired images that indicates that the returned information, which can include a height assessment, can suitably be used for a purpose defined in the capture plan goal where the goal is something other than measurement accuracy. Such uses can include generating non-mathematically accurate 3D reconstructions of that structure. In this regard, the capture plan goal of non-mathematically accurate structure measurements can be achieved from such image acquisition event, and the capture plan used to generate the acquired images can be deemed as suitable. Alternatively, it may be determined that the acquired images were not suitable to generate a non-mathematically accurate 3D reconstruction of the structure, because processing and analysis of the acquired images indicates that at least the height element of the structure cannot be suitably estimated in relation to the other features of the structure. In this case, if the capture plan goal was to be able to generate a 3D reconstruction having a high level of qualitative accuracy, the capture plan goal will not be achieved. Such a non-mathematically accurate capture plan goal can comprise inspection level detail in some implementations.

Alternatively, a numerical measurement can be derived from the acquired images and that measurement information provided with quantitative level of the accuracy for that measurement, such as a percent error between the derived structure measurements and the actual measurement of the structure or part of the structure that was imaged during the image acquisition event when such measurements are generated directly from the structure in real life. For example, the structure being imaged during an image acquisition event can have an actual height of x when measured directly. Measurements can be derived from the imaging information to a provide a height of x ft+/−y inches, where y is an estimated measurement error. If the capture plan goal analysis indicated that the measurement error is within an acceptable % error for the derived measurement, for example, not more than 0.1%, the derived height measurements allow the capture plan goal for the image acquisition event to be achieved.

As a non-limiting illustration, analysis of the imaging information from a completed image acquisition event can be configured to provide feedback associated with the probability that the structure of interest (or parts or portions thereof) was suitably incorporated in the acquired images in accordance with a capture plan in a manner that allowed the capture plan goal to be achieved. Still further, the analysis of the derived structure information in relation to the characteristics of the acquired images can provide feedback related to a deviation or lack of alignment from the capture plan goal caused, at least in part, by the content of the capture plan used to generate the images.

As would be appreciated, not all capture plan goals will be the same. Two different capture plan goals can require that at least some of the acquired images from which one or more structure information types are derived comprise some differing characteristics so as to allow the desired information about the structure to be derived.

Using an unmanned aerial vehicle flight as an example. In some use cases, for example for the purpose of generating measurements of a roof, roofing data can be collected by an unmanned aerial vehicle and imagery is processed into 3D representation of that roof from which the desired measurements can be derived. In other use cases, the vehicle can be operated to acquire images sufficient to enable a detailed inspection of the structure. It is possible that the capture plan used to generate accurate measurements may differ, at least in part, from the capture plan that will generate a good inspection-level result. In this regard, inspection may require close up imaging of the roof so that small defects may be observable (e.g., to determine a condition state, such as hail damage or approximate age), whereas the obtaining of measurements may require imaging from a greater distance. To achieve these differing goals, the respective capture plans can be different in at least some respects. In other use cases, an unmanned aerial vehicle flight may have the goals of both measurement and inspection-level details, which can require that a capture plan be generated to allow both of these capture goals to be achieved.

A capture plan goal may be image stitching to generate orthogonal images, as opposed to 3D reconstruction or measurement of a structure. In this use case, the capture plan can be configured to generate an overall capture of the structure or a birds-eye capture that can generally be without concern for whether one or more of the acquired images may comprise some blur that would otherwise be unacceptable for other capture goals.

In a further example, if the capture plan goal is efficiency, such as in image acquisition time and/or image processing, a capture plan that generates too many images could be problematic. Too many images may extend the image acquisition time, such as in the flight time required for an unmanned aerial vehicle as well as extend processing and image transfer time. A suitable capture plan to address efficiency can be generated to provide the smaller or minimum number of acquired images in a reduced or shortest image acquisition time but still satisfy the capture plan goal(s).

In one aspect, the inventive systems and methods can provide success-related information that indicates or signals the likelihood, in the form of a probability assessment or confidence level, of whether the goals or objectives set out in the capture plan goal were met. Such success-related information can optionally include information that can increase the confidence that the one or more structure information types derivable from the acquired images is correct in context, such as providing evidence, reasoning, data, metrics, etc. to support the returned success-related information and any conclusions associated therewith.

As a non-limiting example of such feedback, an image acquisition event can comprise a unmanned aerial vehicle flight for imaging of a roof of a house. A capture plan goal can be provided that indicates that measurements to within about 1% of the actual roof measurement should be achieved from the image acquisition event. A capture plan intended to achieve the selected level of measurement accuracy can be implemented, and images of the roof can be generated therefrom during an image acquisition event. The acquired images can be processed and then analyzed to determine whether they comprise the characteristics required to generate not only the desired roof measurements, but also to return the range of measurement error specified by the capture plan.

As a non-limiting example of feedback, an image acquisition event can comprise a unmanned aerial vehicle flight for imaging of a cell tower or similar structure. Cell tower imaging and the generation of useful information is described in detail in U.S. Provisional Patent Application No. 62/729,982, filed Sep. 11, 2018, the disclosure of which is incorporated herein in its entirety. As a non-limiting example, a capture plan goal can be provided that indicates that measurements to within 6" of the actual tower height should be achieved from the image acquisition event. Additional goals could include within 1" of the actual RAD height and width, and within 2" of actual RAD elevation above a base plane. A capture plan intended to achieve the selected level of measurement accuracy can be implemented, and images of the tower can be generated therefrom during an image acquisition event. The acquired images can be processed and then analyzed to determine whether they comprise the characteristics required to generate not only the desired tower measurements, but also to return the range of measurement error specified by the capture plan. One example of a means of providing the feedback or error can include selection and presentation of ground control points ("GCP") if present in the scene. Presenting images showing the GCPs showing projection accuracy or offset of center points can communicate a confidence level in the accuracy results and meeting the capture plan goals. Scale constraints can also be applied to generate accuracy information and/or confidence levels.

Still further, feedback or information can be returned that identifies aspects of the acquired images, and therefore information derived or derivable therefrom, that might have differing levels of error or accuracy, where such error or accuracy would be introduced as a result of the characteristics of the acquired images. Such image characteristics can be a result of the capture plan used to generate the images. In the house and roof examples that were imaged by an unmanned aerial vehicle, a user can be provided with an assessment of what parts of the roof are suitable for a particular use. In this regard, there could be a 100% probability that the house was suitably imaged in accordance with the capture plan goal of imaging the house to allow generation of a 3D reconstruction of the house that is accurate for generation of a non-mathematically accurate model of the house and the roof. However, the user can be provided with only a 50% probability that the roof overhang areas were suitably imaged, thereby providing a lesser than 100% chance that a desired goal of achieving an accurate measurement of the roof square footage can be achieved. If the capture plan goal was to generate accurate roof measurements of the total roof area, the defined capture plan goal will not be achieved.

It can be recognized that this example highlights that such returned measurement information signals that problems in image acquisition likely existed as a result of the capture plan used to generate the acquired images from which the measurements were intended to be derived. As discussed hereinafter, information derived from such image and capture plan analysis can be used to generate improved capture plans to improve the ability of a user to achieve a desired capture plan goal.

Alternatively, feedback can be returned that it is unlikely that the desired capture plan goal cannot be achieved. For example, if a desired goal for the unmanned aerial vehicle flight is for accuracy within 1 cm and the SSD generated from the unmanned aerial vehicle-generated images is 5 cm, there will be no chance that the desired accuracy for the subject unmanned aerial vehicle flight will be obtained and the capture plan goal will not be achievable. Appropriate feedback of that absolute failure can be returned. While the information type derivable therefrom will not conform to the capture plan goal for that image acquisition event, such information type can be used to improve capture plans in other contexts as discussed further herein.

Various types of image acquisition characterization can be relevant in returning useful feedback regarding the characteristics of acquired images acquired in an image acquisition event. In non-limiting examples, these can include one or more of The presence or absence of image overlap in different directions and the amount thereof between a plurality of images;

The angle of image acquisition device in relation to an identified/desired surface of an object being captured (i.e., view angle). View angle is defined as the angle that a ray emanating from the camera center intersects with the target surface. The ideal case is that this ray intersects the surface at 90 degrees angle because that is when the image is formed the best;

Structure-Sample-Distance (SSD);

Ground-Sample-Distance (GSD);

Angle of triangulation, where such comprises the angle derivable between two points on two different images of the same structure or structure part;

Re-projection error and accuracy (or lack thereof) of 3D reconstruction or image alignment;

Camera sensor resolution and/or lens distortion;

GPS resolution and noise level thereof;

Image texture type and level;

Image illumination level;

Image noise and blurriness;

Existence of occluded regions;

Image coverage for occluded regions;

Density of the 3D representation of the scene (e.g., density of the point cloud);

Number or interval of acquired sensor observations during the image acquisition event such as number or interval of images or number or interval of GPS readings or number or interval of IMU ("inertial measurement unit") readings;

Image acquisition settings (e.g., aperture, shutter speed, ISO, time-lapse, FPS for video data);

Accuracy of GPS information acquired during an image acquisition event, as indicated by type/model/manufacturer of GPS sensor;

Use of stability sensors or optical image stabilization on imaging device and/or vehicle (e.g., unmanned aerial vehicle, UAV, car etc.) during image acquisition; and Characteristics of sensors (e.g., high or low quality) as indicated by type/model/manufacturer of imaging device (smartphone, camera) or vehicle (e.g., unmanned aerial vehicle, UAV, car etc.).

In a further aspect, after processing of the acquired images so as to derive one or more information types relevant to the structure of interest, which could include, for example, generating a wireframe or 3D reconstruction of the structure, additional analysis can be performed on the acquired images, information incorporated therein or derivable therefrom, as well as any other information that may be associated with the acquired images. Such associated information can include, for example, weather or temperature information or time of day and/or position of the sun related to the structure that may be relevant to generation of the acquired images during the image acquisition event. In this regard, the system and methods herein are configurable to provide information on what steps or actions were conducted when acquiring the acquired images and any other pertinent information used to generate the images from which structure information was derived.

Upon processing of the acquired images, a wireframe can be generated therefrom, for example. This wireframe can be further analyzed to assess the overall coverage of the structure by the acquired images, such as by determining the quality of coverage and occluded areas on the structure. If an absence of coverage and/or occluded image areas are revealed by such analysis, it can be inferred that such absences of acquired images pertinent to the structure of interest resulted from the capture plan used to generate the acquired images.

For example, generation of a 3D reconstruction of the structure of interest could have included extending a wireframe into occluded areas present in the acquired images. Still further, the 3D reconstruction could have been generated by extending edges to intersect in areas in which there was no associated point cloud derivable from the acquired images, for example, because the images included occluded areas, missing areas, or for other reasons. Still further, illumination information could be absent from the structure image information, which can affect the type of information derivable from the captured information. If a 3D reconstruction of the structure of interest was generated when potentially pertinent information was absent from the acquired images, it can be inferred that the information derived therefrom may not include the characteristics necessary to achieve a specified capture plan goal. Moreover, recognition that pertinent information may be missing from the acquired images could indicate that the capture plan by which the images were generated was not accurate or complete.

Analysis of the acquired images and the structure information derived therefrom can help provide a diagnosis of the reasons for the absence of relevant information needed to achieve the capture plan goal desired from an image acquisition event. That is, failure to achieve a specified capture plan goal, and how to rectify that failure, comprise new insights provided by the inventors herein. Such insights can be used to develop improvements in image acquisition, for example, by generating improvements in capture plans as discussed herein after. Such insights can also be useful to improve image processing so as to enhance the nature and quality of structure information derivable from an image acquisition event that is conducted in subsequent capture plan deployment.

Appropriate feedback can be provided to a user that the capture plan goal and associated capture plans did not provide the desired coverage of the scene or environment and any structures (or objects, people, animals, etc.) located therein, and that any images acquired during the image acquisition event may not allow the defined capture plan goal to be achieved. Moreover, such analysis and associated feedback can also provide information regarding the accuracy (or lack thereof) of the derived structure information.

Using aerial imaging of a house and roof as an example, when a user views the pre-processed output of the house and roof images on his screen, he might subjectively believe that the camera has covered the house and roof sufficiently well because it will be difficult, if not impossible, to visually observe image acquisition errors that might negatively affect the ability to derive the intended information about the structure of interest. In other words, a human supervisor of an image acquisition event may be unlikely to be able to determine visually in real time or substantially in real time that the acquired images generated according to the capture plan being implemented cannot be suitably processed to derive structure information that allows the capture plan goal to be achieved. As a result, resources expended for the image acquisition event could be wasted, and any capture plan goals, such as the generation of a cost estimation report for a customer based on information derived from the acquired images, may not be achieved.

Still further, the qualitative or quantitative accuracy with which a wireframe was derived from captured image information that includes the structure or object of interest can be provided. For example, a wireframe may be projected or estimated from such image information, and this wireframe can be compared to or compared with previously confirmed or validated acquired images for the object of interest. This can allow a wireframe generated from images captured in a second image acquisition event to be referenced to a wireframe generated in a first image acquisition event. In this regard, one or more areas of a generated wireframe that are associated with reconstructions having a low confidence of qualitative or quantitative accuracy can be identified via feedback by such a validation or confirmation step. Such areas of low confidence can also be stored as potentially relevant to generation and implementation of the capture plan that resulted in the generation of a wireframe having low confidence. Comparison of the first capture plan and the second capture plan, along with analysis of acquired images and structure information respectively associated therewith, can be used to generate improvements in capture plans as discussed elsewhere herein.

Information associated with whether or not a capture plan goal was met in an image acquisition event can be incorporated into instructions pertinent to subsequent image acquisition events. For example, if analysis of the acquired images indicates that one or more features or aspects of a first capture plan was implicated as a reason why a capture plan goal was not achieved, instructions associated with a second capture plan can be modified to provide improvements.

Areas of a generated wireframe or plurality of wireframes from which a 3D reconstruction can be generated can be visually identified for a user, such as by coloring or otherwise indicating in an observable way. Yet further, confidence levels in the presented 3D reconstruction, and any information derivable therefrom (e.g., measurements, identification, topology, etc.) can be quantified or qualified as feedback for a user or for incorporation into instructions associated with operation of the capture plan or for use in subsequent capture plans. For example, for an occluded area present in the acquired images that were generated from a capture plan, a confidence level in the 3D reconstruction of that occluded area can be provided, for example, at least 75% confidence that the structure of interest (or part of the structure of interest) was accurately reconstructed. For other areas of a 3D reconstruction that may have differing levels of occlusion or other imaging characteristics that may reduce the accuracy of a 3D reconstruction, a confidence level for that area of the structure may be different, such as being higher or lower. Accordingly, the present disclosure can optionally provide one or a plurality of reconstruction accuracies for a 3D reconstruction of all or part of a structure of interest. In this regard, one reconstruction accuracy can provide an overall reconstruction accuracy for the structure or part of the structure, whereas a plurality of reconstruction accuracies can provide accuracies for various parts of the reconstruction of the structure or structure part.

The reconstruction accuracies can be presented qualitatively or quantitatively as discussed elsewhere herein. A user can then be provided with not only a qualitative report as to what part or parts of a structure may not have been accurately reconstructed from the acquired images, but also a quantitative report as to the overall accuracy of the reconstruction, as well as the accuracy of reconstruction for specific parts of the object.

For example, the overall accuracy of a 3D reconstruction of a house imaged according to a unmanned aerial vehicle capture plan can be determined to be of high qualitative accuracy (e.g., "good" or "acceptable"), but a specific part of the house reconstruction, such as one or more areas of roof overhang where occlusions may be present on the acquired images, may be of low qualitative accuracy (e.g., "poor" or "unacceptable"). Alternatively, the user can be provided with feedback that the quantitative quality of a 3D house reconstruction as the desired information type to be derived was high (e.g., 95% or greater reconstruction accuracy), but that the quality of reconstruction of one or more areas on the house near a roof overhang may be of lower quantitative quality (e.g., 50% or less confidence level of reconstruction accuracy). Such qualitative and/or quantitative accuracy information can be used to determine whether one or more aspects of the capture plan used to generate the acquired images from with the 3D house reconstructions were suitable to achieve the capture plan goal. If not, such information can be used to generate improvements in capture plan generation and implementation, as discussed elsewhere.

The acquired images generated from a capture plan wherein all or part of a structure of interest is imaged during an image acquisition event can be processed in a variety of contexts to generate useful feedback and conclusions as to the effectiveness in achieving the capture plan goal. In non-limiting examples of such processing categories, one or more of the following image-related characteristics can be analyzed from the acquired images (with other examples present in the disclosure herein):

Point cloud density;
Point cloud completeness with no holes or non-reconstructed areas as related to the structure of interest;
Reconstruction accuracy and reprojection error;
Occlusion;
Point cloud noise;
Camera pose error;
Accuracy of ground control points;
Presence or absence of image overlap in different directions and the amount thereof;
Angle of image acquisition device in relation to an identified/desired surface of an object being captured (i.e., view angle);
Structure sample distance;
Angle of triangulation;
Re-projection error and accuracy (or lack thereof) of 3D reconstruction or image alignment;
Camera sensor resolution and/or lens distortion;
GPS resolution and noise level thereof;
Image texture type and level;
Image illumination level; and
Image noise and blurriness.

The systems and methods of the present disclosure can provide a user with feedback associated with quality of the 3D reconstruction of a structure of interest as derived from acquired images, where such feedback may include direction that the user perform a second image acquisition event to improve image acquisition. Moreover, in some notable aspects, the present disclosure provides feedback of what circumstances could have caused the image acquisition to fully or partially fail so that a capture plan goal could not be achieved. In this regard, a capture plan generated for a second capture event can be configured to reduce or eliminate those characteristics or situations in image acquisition that influenced or caused problems in the first image acquisition event.

Such identification of one or more problematic image acquisition aspects or characteristics that occurred in a first image acquisition event and the reduction or elimination of such problematic aspects in a second image acquisition event can be generated automatically by creating a new capture plan for the second (or subsequent) image acquisition event or by modification of the first capture plan to include corrections as indicated from failure analysis of the output of the first image acquisition event. In this regard, correction of the second capture plan can be provided substantially without user interaction.

For example, if a first image acquisition event does not generate suitable imaging information to meet a specified capture plan goal for the structure of interest because the acquired images include too many occluded areas to allow an accurate 3D reconstruction of the structure to be generated, instructions can be incorporated into a second capture plan so that subsequently acquired images for that same structure generated in a second image acquisition event are less likely to include such occlusions that caused problems with the output of the first image acquisition event. In this regard, if an overhang on a house is poorly imaged in the first image acquisition event in which a first capture plan is implemented, the second capture plan can include navigational and operational instructions for the unmanned aerial vehicle that will facilitate generation of additional images of at least that area of the house, that is, roof overhang areas, where occlusions were evident in the previously acquired images. Through such correction of the second capture plan, it can be expected that there will be fewer or even no occluded areas in the acquired images of the structure, and that 3D information derivable therefrom can incorporate improved accuracy vs. the 3D information obtainable from the first image acquisition event. Additionally, such knowledge that a house of a particular style, design, location, etc. might be likely to generate occluded areas in images generated therefrom can be incorporated into a capture plan for a different structure with the goal of enhancing the likelihood that an image acquisition event for that structure will result in achieving the capture plan goal for that structure with only one image acquisition event needed. As one example, a capture plan can be generated that utilizes two different imaging devices to address areas of a structure that might be difficult to suitably image based on the style or design. A house may require unmanned aerial vehicle image acquisition for the roof and a high resolution camera for upper stories, whereas ground level capture could be conducted with a smartphone camera.

Still further, the identification of image acquisition features or characteristics that are associated with capture plans and acquired images generated therefrom that are likely to or that will cause a capture plan goal to not be achieved can be useful to train users to design improved capture plans, and therefore execute better on capture plans.

The information derived from capture plan and capture plan goal analysis according to the methodology disclosed herein could, over multiple image acquisition events, lead to the generation of greatly improved capture plans for a structure of interest that can be implemented by either or both of a computer or user that would reduce the overall failure rate of image acquisition events when the desired capture plan goal is not achieved. In this regard, if over multiple image acquisition events, fewer occlusions are generated in the acquired images because analysis of capture plans and capture plan goal success or failures can provide information on how subsequent capture plans can be generated and implemented to reduce the number of occluded areas. Thus, it could be expected that the 3D information derivable from an image acquisition event be improved over time. The present disclosure therefore further incorporates systems and methods to improve capture plan generation and implementation.

Moreover, the methodology of the present disclosure can have utility in training of pilots who are flying (if a manned flight) or directing the flight (if an unmanned flight), at least by providing them with feedback in real-time or substantially in real-time to correct or modify a capture plan being implemented by that pilot. This real-time or substantially real-time feedback will then not only better ensure that the acquired images generated during that image acquisition event will be more likely to allow the capture plan goal to be achieved, but the feedback may also be incorporated in that pilot's self-directed capture plans in future image acquisition events.

As a non-limiting example, the real-time or substantially real-time feedback can be generated using an estimator (i.e., inference model) that has the following characteristics:

Measurements or observations such as GPS reading, IMU readings, image acquisition device motion control parameters, etc. that can be expected to be noise corrupted and the uncertainty in these measurements or observations can be expected to be translated to uncertainty in inference;

Any a priori information that can be expected to be incorporated in the estimation;

A model might be employed to determine how a system is expected to evolve over time;

It is not expected that the measurements or observations will always be in a pre-defined coordinate system; and It is expected that the model itself be uncertain.

In view of the above, a goal or objective can be to obtain the best estimate $\hat{x}$ for a parameter x given a set of k measurements or observations $Z^k = \{z_1, z_2, \ldots, z_k\}$. The following likelihood function can be defined to represent the conditional probability of the measurement z given a particular value of x:

$$L \triangleq p(z|x)$$

considering a Gaussian distribution for noise and a normalizing constant n:

$$p(z|x) = \frac{1}{n} e^{\frac{-1}{2}(z-x)^T P^{-1}(z-x)}$$

the maximum likelihood estimate $\hat{x}_{m.l}$ can be calculated as:

$$\hat{x}_{m.l} = \arg\max_x p(z|x).$$

The disclosed methodology can also have utility in directing or correcting the capture plan of an operator of a terrestrial or underwater vehicle by providing him with real time feedback of whether a capture plan will generate information about the structure of interest that will allow the capture plan goal to be achieved. Also, it could be expected that such feedback will be incorporated in the driver's implementation of subsequent self-directed capture plans. In this regard, the disclosed methodology can also include a method to train a pilot of an aerial vehicle or a driver of a terrestrial or underwater vehicle to acquire images via a capture plan that is directed toward generating images that meet a goal or target for the image acquisition event for which the pilot or driver is acquiring images.

In further aspects, the disclosed methodology comprises the performance of at least two image acquisition events, wherein acquired images of all or part of a structure of interest are generated during each image acquisition event according to implementation of a generated capture plan, wherein the capture plans for each image acquisition event are not substantially identical. Generation and/or implementation of each defined capture plan can be by either or both of a computer or a user. The acquired images from each image acquisition event and capture plan can then be processed according to the methodology herein to determine whether the information types derivable from each set of acquired images, respectively, allows a defined capture plan goal to be achieved. The effectiveness of each capture plan to generate the desired capture plan goal for the image acquisition event can be identified so as to allow only that structure information derivable from the better capture plan to be utilized, for example.

Still further, a plurality of capture plans that can be used to generate acquired images of a structure of interest can be ranked as to their effectiveness in allowing a defined capture plan goal for an image acquisition event to be achieved. Such insight can be used to select for implementation of capture plans that can allow a specific capture plan goal to be achieved, while at the same time using only the imaging resources and generating only the number of acquired images needed to achieve the capture plan. For example, analysis of images acquired according to a capture plan may indicate that the capture plan did not provide acquired images having the characteristics needed to allow accurate measurements to be derived for the structure of interest. If the capture plan goal for that image acquisition event is to obtain accurate measurements, that capture plan would fail to provide the desired result. Thus, selection of that capture plan for use in a subsequent image acquisition event where accurate measurements of the structure are desired would be improper. However, other useful 3D information about the structure may still be derivable from acquired images generated according to that capture plan. If a capture plan goal indicates that less-than-accurate measurements of a structure are indicated, that previous capture plan cane be selected for use.

Such selection of a capture plan based upon the capture plan goal for an image acquisition event can result in a reduction in the amount of resources needed to generate information about a structure of interest. For example, if only general or qualitative information is needed for a structure of interest, fewer images in fewer locations in and around a structure and an associated scene may need to be acquired. This can reduce the time needed to operate the imaging device, which can be beneficial when the image acquisition device and the navigational and operational componentry associated therewith are battery powered. Fewer imaging devices and operators may be needed if imaging time can be reduced. Moreover, generation via an unmanned aerial vehicle of a captured image set of sufficient quality to allow numerically accurate measurements of a structure to be derived may require additional image acquisition resources and imaging processing time that, in some situations, may not be desirable to expend.

To illustrate, an accurate 3D reconstruction of a structure may be obtained from acquired images during a first image acquisition event, but the analysis of those acquired images may indicate that the desired measurement accuracy was not derivable from the acquired images generated from the first capture plan. Instead, to obtain the desired measurement accuracy for the structure, a second image acquisition event must be conducted. This will require more unmanned aerial vehicle flight and operator time, as well as more image processing capability. If, in the future, less than measurement accuracy is desired from an image acquisition event, the capture plan that generates the desired quality or quantity of 3D information for the structure of interest can be selected and implemented. If the capture goal is instead measurement accuracy, the capture plan that did not give the defined goal will not be used. The elimination of capture plans from a list of capture plan options via selection (or deselection) thereof can better ensure that resources can be better utilized and better results can be returned to a user more quickly.

Communication of one or more of the capture plan analysis, image processing results, user feedback, or improvements to be made in subsequent capture plans can be via delivery of information to the user, where such delivered data can be qualitative (e.g., color, shading, heat maps, sounds, condition state etc.) or quantitative (e.g., measurements, angles, counts etc.). Information can be delivered to a user via website, or printed, or through API, etc. The delivered information can include a description of the relevant capture plan(s), the effectiveness of the plan(s) in allowing images acquired therefrom to be suitably processed to meet the capture plan goal for that image acquisition event. Suggestions for improvements in capture plan generation and implementation can also be communicated to the user, or such information can be incorporated in instructions associated with generation of acquired images in an image acquisition event.

Still further, the delivered capture plan analysis information can include predictions associated with a relative or absolute accuracy of derived 3D information for one or more regions of the structure of interest as derivable from acquired images generated from a capture plan. For example, an image acquisition event can comprise a defined capture plan goal of generation of accurate measurements of a roof as an information type to be attained via image acquisition by unmanned aerial vehicle. The acquired images can be generated using a capture plan that causes the unmanned aerial vehicle to fly in a capture plan intended for reconstruction accuracy, but not measurement accuracy. Such accurate measurements may be needed by a contractor or insurance company to provide information needed to repair or replace the roof, in one implementation. If the selected capture plan is known to not provide the intended capture plan goal, accurate measurements will not be obtained. However, the derived 3D information for the roof can still have utility in roof estimations. Accordingly, the relative accuracy of information derivable from a capture plan can be provided to a user. The user can then adjust any estimates provided to a customer to account for the known lack of accuracy in the 3D information generated from that capture plan, for example, by adding or subtracting a percentage or value from the generated numerical information.

Information returned to the user could also provide a quality rating for a capture plan. For example, if the capture plan goal is directed toward generation of accurate measurements of all or part of a structure, and the analysis of the images acquired from a capture plan indicates that such measurements are not derivable therefrom, the capture plan and the associated image acquisition event can be denoted as "fail" or the like. If the analysis shows that the capture plan goal has been achieved by the capture plan, the capture plan can be denoted as "success" or the like. For failures, the structure information derived therefrom can be placed in a "rejection queue" to prevent its use in downstream applications. Similarly, information that meet the capture plan goal can be placed in an "" acceptance queue" for use in downstream applications. The respective capture plans and information associated therewith can be stored for use in generating or analyzing other capture plans and conformance thereof with capture plans, if appropriate.

As indicated elsewhere herein, information that does meet a capture plan goal may nonetheless be suitable for other image acquisition events. Accordingly, a previously rejected capture plan can be selected for use in a current image acquisition event.

Information associated with an image acquisition event or information derived from the acquired images can be displayed visually to a user in the form of 2D image or as a 3D tool. Visual display could be in 2D images or in a 3D tool, in some implementations. Various user presentation examples are described in U.S. Patent Publication No. US20180053347A1, the disclosure of which is incorporated herein by reference.

Information derived from the image acquisition event, including information about the structure derived from the acquired images, is configurable to be provided to a user in per point or per location on the structure from which such information is derived. Such derived information can also be presented to the user in summary form, such as in a report or the like. The derived information can also be stored as data in a form suitable for use in other processing operations in which the capture plan, the analysis, and information types derived therefrom can be useful.

The user can be provided with feedback related to the suitability of the selected imaging device to generate a defined capture plan goal. For example, the characteristics of images generated from a specific imaging device may be unsuitable to meet a specified capture plan, even with generation and implementation of an optimum capture plan. While such suitability between an imaging device and the capture plan goal can be applicable to a variety of image acquisition event types and structures of interest, the specific example of unmanned aerial vehicle image acquisition via a provided capture plan is illustrative. As would be recognized, the quality of the imaging sensor on the unmanned aerial vehicle can operate as a baseline for the quality of acquired images generated in an image acquisition event. Therefore, the quality of imaging information for the structure can be affected by the selection of an imaging device. In this regard, a defined capture plan goal may be generation of accurate measurements of a structure of interest as the information type to be obtained. However, the imaging sensor on the unmanned aerial vehicle may not comprise the appropriate imaging characteristics required to deliver such measurement accuracy when the defined capture plan instructs the unmanned aerial vehicle to acquire the images from too far away to allow generating suitable image resolution. That capture plan goal may nonetheless be suitable for use with an unmanned aerial vehicle that incorporates a higher resolution image sensor. In such a case, the user can be provided with information about the mismatch between the specified capture plan goal at the image acquisition event, and the likely or certain failure of such capture plan goal to be achieved if that unmanned aerial vehicle is used. As with other capture plan goal analyses herein, information about the relationship between a certain imaging device and a capture plan goal can be stored for use.

Still further, the present disclosure can provide feedback as to the qualitative and quantitative characteristics of whether a specific capture plan did or did not allow a capture plan goal to be achieved, as well as what information about the structure of interest is derivable as a function of a capture plan. For example, analysis of acquired images could deliver feedback such as there is a 100% probability that enough images were captured of a target area such as a roof were covered from implementation of a capture plan that was intended to generate roofing information and/or measurements. However, with the implemented capture plan, feedback could be delivered that there was only a 50% probability that the roof overhangs were successfully imaged. In regards to these returned probabilities, feedback could be provided that there is a 95% chance one can reach the capture plan goal of accuracy with a implementation of a selected capture plan.

Alternatively, feedback could be provided that there is no way that the capture plan goal can be achieved using a selected capture plan to image a structure of interest. In this regard, each capture plan can be generated according to a design or plan that is directed toward effectively achieving the desired capture plan goal to be implemented for different structure types, the locations of the structure, the environment in which the structure is located, the time of the image acquisition event, the weather, among other things. For example, a capture plan that is suitable to acquire images of a residential roof on a bright spring day to derive useful information therefrom might be very different from a capture plan that is suitable to acquire images of a cellular tower in the winter for inspection. Moreover, as discussed, a capture plan that is suitable to derive reconstruction accuracy may be wholly unacceptable to generate measurement accuracy, even when the same structure of interest is involved. Feedback can be provided to make sure that a generated capture plan is suitable for the intended capture plan goal.

Also, inappropriate capture plans can be automatically locked out from use when a specified capture plan goal cannot be achieved using that capture plan. For example, if the SSD for a capture plan cannot allow the desired accuracy in a selected capture plan goal to be achieved, that capture plan can be removed from use for that and similar image acquisition events.

Feedback and conclusions that can be implemented to provide useful information about the effectiveness of a capture plan in achieving a capture goal include, but are not limited to (with other examples present in the disclosure herein):

Image overlap amount;
Capture device angle with respect to a given/desired surface;
Structure sample distance;
Angle of triangulation;
Re-projection error and accuracy of 3D reconstruction or image alignment;
Camera sensor resolution and lens distortion;
GPS resolution and noise;
Texture level;
Illumination;
Image noise and blurriness;
Image coverage for occluded regions;
Density of the 3D representation of the scene (e.g., density of the point cloud);
Number of observations such as number of images or number of GPS readings for a point or number of IMU (Inertial Measurement Unit) for a point, etc.; and
Improper capture settings (aperture, shutter speed, ISO, time-lapse, FPS for video data).

After processing the acquired images, which could include generation of a wireframe or a 3D representation of the structure of interest, additional analysis on the processed image information to identify any steps that were used to create or generate the 3D representation for areas where the acquired images may have been missing at least some information about an area that is included in the reconstruction. For example, an applied step could have included extending a wireframe into areas that were occluded in the acquired images, or an applied step could have involved extending of edges to intersect in areas with no generated point cloud, either because occluded areas, missing coverage, or others. The need to apply correction or augmentation steps to the 3D reconstruction can indicate a lack of completeness and/or coverage from a capture plan that can be improved when the reasons for the problems in the capture plan are deconstructed by evaluating the acquired images generated in the first instance by that capture plan.

A user who reviews the generated imaging information prior to processing might see that acquired images are providing full coverage for the structure of interest. The flight path of an unmanned aerial vehicle is shown in FIG. 1, as path 105, and the locations relative to the roof structure where the capture plan instructions provide for acquisition of images is shown by circles 110 on path 105. Once the generated plurality of images are processed, missing information needed to meet a defined capture plan goal can be indicated by the failure to obtain the desired information type from the acquired images generated in an aerial flight. For example, a wireframe or accurate 3D reconstruction may not be obtained as defined in the capture plan goal. In this event, additional processing of the acquired images can be used to identify aspects of the capture plan that may have been a cause, or part of the cause, of the capture plan goal not being met.

As shown in FIG. 1, such areas of concern can be visually identified as areas with missing imaging information or where the characteristics of the underlying imaging information result in those areas of the derived information lacks confidence in 3D reconstruction accuracy, for example. In this regard, shading 125 in roof 100 shows areas where "too few" images were obtained, which can also be termed "under-sampling." Such under-sampling can result in a lack of confidence in the information generated therefrom, at least because there may not be enough information derivable from the acquired images to create the desired qualification or quantification for the structure, here a roof. On the other hand, acquired image information indicated by shading 115 in FIG. 1, which can be termed as "over-sampling" of images, or "too many" images acquired in those areas. When more images are acquired than are needed to derive the information type and accuracy thereof as set out in the capture plan goal, at least extra processing and storage are needed to provide the desired information. Although the information obtainable from such oversampling of images may have a high degree of accuracy when the image processing is complete, the capture plan goal may not have had accuracy of the generated information as an intended outcome. Thus, such over-sampling of images is an example of a defined capture plan not being met by an image acquisition event. Shading 120 in FIG. 1 illustrates areas in the capture plan associated with FIG. 1 that can be considered to provide a balance between too few and too many acquired images in an unmanned aerial vehicle. In other words, shading 120 illustrates areas in where the desired information type has been achieved, and the defined capture plan has been met in those areas.

Information associated with such over-sampling, under-sampling, and "just right" image acquisition characteristics can be included in instructions associated with second, or subsequently performed, capture plans. Such information of whether a defined capture plan goal has been met (or not met) can be included in instructions associated with subsequent capture plans used in image acquisition events for the same structure (i.e., to acquire a second image plurality of images for the same structure) or to generate a capture plan for use to acquire images for a second structure that is different from the first.

In some implementations, visual feedback associated with a capture plan can be provided as illustrated in FIG. 1, where the path of the aerial vehicle is shown by the arrows. Such feedback can provide shaded as in FIG. 1, colored, labelled, or quantified for presentation to a user. Such information can also be used to highlight potential areas of concern in a capture plan.

In some aspects, a capture plan can include information that provides thresholds for image acquisition parameters. For example, and as would be recognized, in order to extract information from a plurality of images of a structure or structure part, at least some of the acquired images must have a suitable amount of overlap, for example, at least about 10 or 20%, or more of less. It follows that generation of information from an image acquisition event should obtain not only enough images of a structure or structure part of interest, but also enough images that are overlapping. Accordingly, a capture plan that is generated for imaging of that structure or structure part can include instructions that allow such suitably overlapping plurality of images to be generated. On the other hand, and as discussed elsewhere herein, a capture plan goal may not require a degree of detail that dictates acquisition of a large number of images. For example, inspection-level detail may typically require fewer overlapping images of the structure or structure part (or object etc.) than measurement detail would require. As such, a capture plan may be configured to acquire more or fewer images having more or fewer parameters (e.g., view angle, angle of triangulation, SSD, GSD, etc.), where such parameters are indicated by a defined capture plan goal.

Returning to FIG. 1, shading 120 can then represent a threshold that has been achieved for a specific image parameter, which can also comprise an "information type" defined by a capture plan goal. In contrast, shading 115 and 125 can represent areas where acquired images are more or fewer than the target threshold, and thereby can indicate that a defined capture plan goal has not been met. In non-limiting examples, the thresholds set for the information types derivable from a capture plan illustrated for roof 100 in FIG. 1 were:

1) Angle of triangulation (threshold=3 degrees);
2) Overlap (threshold=4 image views);
3) View angle (threshold=30 degrees);
4) SSD (threshold=0.5 in.); and
5) Measurement accuracy (threshold=0.5 in.).

Still further, for a given occluded point in a 3D reconstruction of a structure where the reconstruction is derived from a set of acquired images that include a plurality of occluded areas, a confidence level for a first predicted structure area on the reconstruction might be 75%, but another confidence level for a second predicted structure area might be 85%. A heatmap can be generated for those regions that might be associated with a lower confidence in the accuracy of the reconstruction.

In a further broad implementation, the present disclosure also allows subsequent image acquisition events to be improved, such as by implementation of better capture plans. When a capture plan is conducted under similar circumstances in a future image acquisition event, extra care can be given when acquiring images in or at those areas in a structure that were shown as being problematic in the previous image acquisition event. For example, a user who is implementing a capture plan can be provided with feedback relevant to specific areas of the structure of interest. This feedback can direct the user to capture a specific portion of the structure in order to improve the outcome or resolve any issues. The disclosed methodology also can provide highlighting of problem areas (e.g., areas of reconstruction that have low confidence) to inform the user that there may be a problem with the derived structure information and suggest that a second image acquisition event be conducted. Still further, the present disclosure can provide the user with specific information of the cause of such missing information and also direct the user on how such an imaging problem can be rectified in future image acquisition event. Moreover, in some aspects, the disclosed methodology can provide a quantitative analysis of the missing image information. For example, a user can be informed that "5 feet of the area below this roof overhang is partially missing from the acquired images," and the location of that area can be visually identified for a user. When a capture plan is implemented for that structure or another structure having similar features in the future, the area of concern, here 5 feet of area below the roof overhang, be subject to extra or more robust imaging.

The methodology of the present disclosure can be useful for training people how to generate improved capture plans, and to better implement those improvements when generating images of a structure of interest. To this end, the additional processing that can identify why problems may have occurred in a structure reconstruction and the generation of information related thereto (e.g., measurements, identifications, topology etc.) can provide capture plan scenarios during training that can later be avoided outright because the person has already been trained to recognize that problems may arise if used in a real image acquisition event.

Post-processing of generated reconstructions to identify reasons for errors in the 3D reconstructions can be used when a user is conducting image acquisition at a location. The user can conduct multiple image acquisitions while at the location. Processing of each set of acquired images onsite to generate reconstructions while at the location, followed by an analysis of the reconstructions to determine whether the capture plan resulted in incomplete acquired images can allow the user to ensure that he can acquire the right type and amount of acquired images in a single trip to the location. If missing acquired images and the reason thereof are identified by analysis of the reconstructions and associated image onsite, the user can apply such information to direct or inform implementation of a capture plan in a subsequent image acquisition event while on location.

Communication of analysis/results/feedback related to evaluation of the reconstructions and any problems associated with previous and subsequent image acquisition according to a modified or improved capture plan can be with visual data or quantitative data, delivered through website, or printed, or through API, etc. The communication to a user could describe the capture plan, show the effectiveness of the capture plan for meeting the capture plan goal, as well as communicate improvements to be used in subsequent capture plans. The user can also be provided with information that predicts the expected or relative accuracy in structure information overall and per structure region if the identified improvements or modifications are made to the capture plan in a subsequent image acquisition event. All or part of the visual data can be combined to create a health rating for information that has a specific rejection criterion.

Visual display of information to a user of information related to reconstruction errors and associated modification to capture plans, among other things, can be in 2D images or with a 3D tool. Visual data presented to the user in this regard can be as described elsewhere herein. Information related to reconstruction errors and associated capture plans can also be presented in summary or other form.

Feedback can also be provided about an imaging device that was utilized to generate a 3D reconstruction, and any limitations or specifications that might affect the generation of reconstruction errors. For example, if the imaging device has only a specific esolution camera, and the distance between the imaging device and the structure of interest is large as defined by the capture plan, the image acquisition might appear suitable, but the image device specifications might be inappropriate in SSD to generate reliable results for the capture plan.

In a further implementation, the methods and systems of the present disclosure can allow a capture plan and the associated acquired images to be analyzed during an image acquisition event to determine whether the defined capture plan goal will be met. Such real-time or substantially real-time processing of the acquired images and any information types derived therefrom can be especially useful when the image acquisition is being conducted without a human operator, for example, when the image acquisition is done using an autonomous vehicle or a robot. However, the real time or substantially real time processing of acquired images while an image acquisition event is underway can also be useful when the acquired images are being generated by novices or non-expert or even expert operators. The processing of acquired images during an image acquisition event can allow the capture plan, images captured therefrom, and any structure information derived therefrom to be directed or managed in response to information that is in the process of being generated at that time, and not after an image acquisition event is completed.

Feedback resulting from processing of the acquired images during an image processing event can be provided to a user and/or directly incorporated in the capture plan that is currently underway, as such user feedback is described elsewhere herein.

If the images are being captured by a mobile device, and detailed analysis of the likely outcome for an image acquisition event that is currently underway, distance between the imaging device and the structure can be especially pertinent to the accuracy of the reconstruction of the structure and any information related thereto. Texture can also be relevant to such results and feedback on texture levels and their impact could result in suggesting a different device to capture effectively.

The real time or substantially real time processing of images during an image acquisition event has utility in image acquisition via mobile devices such as smartphones and the like, as well as with unmanned aerial vehicles and other use cases.

Real time machine learning can be applied to information relevant to the structure of interest or the scene or environment in which the structure is included, or with which it is associated.

In one aspect, the real time or substantially real time processing of acquired images during an image acquisition event can allow changes to be made dynamically to a capture plan while image acquisition is still underway. For example, instructions can be provided to the navigational and operational componentry of a vehicle on which the imaging device is configured. Some instructions can comprise:

1) slow down movement of the imaging device if images show poor texture;
2) slow down movement of the imaging device if time of day signals poor illumination of the scene or structure;
3) change viewing angle to better capture occluded areas;
4) change movement direction to better capture occluded areas;
5) change movement direction where geometric components require more careful imaging;
6) change overall pattern (e.g., add double cross to and orbit pattern);
7) fly lower and slower where hail or other damage condition detected or predicted; or
8) on multi-sensor unmanned aerial vehicles, switch from RGB to Infrared, switch from RGB to Lidar, etc. Changes to the capture plan can also be made dynamically based on user or computer input or feedback from the capture device or other sensor about conditions of the scene or changes in capture plan goals or other reasons.

Still further, the present disclosure can provide predictions for the expected image acquisition effectiveness from a proposed capture plan prior to the beginning of an image acquisition event and alignment thereof with a capture plan. To generate such a prediction of the outcome of an image acquisition event, including the accuracy or lack thereof any information derivable from acquired images generated according to a capture plan, several inputs can be useful. For example, one or more objectives for the image acquisition event, that is, the capture plan goal, can be provided as discussed previously. To generate a capture plan that is appropriate for implementation to achieve the defined capture goal, various information can be provided that may be relevant to the nature and quality of the acquired images, as was also discussed previously.

Generation of a prediction of whether a capture plan goal will be met by a capture plan may be facilitated by additional information such as:
The scene pulled from outside sources (e.g., Google Earth®, Google Maps®, satellite data, weather sources);
Nearby building information;
Material or color of structures;
Weather;
Premises access rules relevant to the image acquisition event;
Lighting and sun path; and
Occlusion prediction, etc.

Such provided inputs can allow estimation of the some or all of the same post-capture metrics that would be present in acquired images. One or more capture plans can be simulated using information derived from analysis of information types derived from previous image acquisition events using known inputs relevant to a scene, structure, etc. that is associated with an upcoming image acquisition event and an associated capture plan goal. In this regard, a likelihood of whether or not a proposed capture plan goal can be obtained to better ensure that a capture plan goal for a future image acquisition event can actually be achieved. If the prediction indicates that the capture plan goal cannot be met from implementation of a capture plan, the proposed capture plan can be rejected. One or more additional capture plan goal predictions can be generated until a desired prediction is generated.

Still further, a partial set of inputs can be provided, and feedback provided of a prediction that a capture goal will be met by a capture plan, although a prediction based on such fewer inputs may have less confidence.

Information associated the prediction regarding the capture plan and capture plan goal can be used to validate or confirm whether the prediction was accurate (or not), and the degree to which accuracy results. Such validation or confirmation information can be incorporated to further improve capture plans for later use.

As part of the prediction, a suggestion that can aid in the generation or design of a capture plan that can allow the capture plan goal to be met can be provided. A suggestion that a specific image acquisition device or combination of image acquisition devices can be generated. For example, if the capture plan goal is to capture an entire structure of interest, and user inputs or system information determines that large overhangs are present on the structure, the system could determine that capture from multiple angles is required using a combination of ground-based image acquisition and unmanned aerial vehicle or aerial-generated image acquisition. In a further example, if the capture goal is a siding estimate, a prediction can be provided of what aspects of the structure of interest should be imaged from a unmanned aerial vehicle and what aspects should be imaged from a ground-based device, where the ground-based device can comprise a combination of devices, such as a handheld device for lower sections of the structure and a higher resolution device for upper sections.

In conjunction with the prediction, the system can specify minimum image device requirements, such as camera resolution, type of device, battery life, etc. For example, generation of the required texture to meet the capture plan goal might require depth sensing or LIDAR, or the needed angle for the image acquisition might require an unmanned aerial vehicle equipped with a specific camera type. In a further illustration, the presence of a roof overhang and/or the height of structure walls might require use of a high-resolution camera from ground level. Still further, a time of day may need to be specified for the images to be taken to avoid glare etc. These and other relevant information and actions needed to achieve the desired capture plan goal can be provided to the user to ensure that the predicted result will, in fact, be attained.

In further aspects, when changes or modifications are made to a capture plan for a unmanned aerial vehicle, such changes or modifications can be configured to be incorporated information associated with other software that can be used in acquisition of images of a structure, etc. For example, information about improvements that can be made in the acquisition of images (e.g., vehicle operation, navigation and/or image acquisition) that is derivable from a first capture plan and evaluation of whether the goals of that capture plan have been met (or not met) can be incorporated for use with flight plans associated with products such as Precision Mapper®, Pix4D Capture®, software included with unmanned aerial vehicles, among others. Moreover, to the extent that the systems and methods of the present disclosure can generate recommendations for modifications to the settings of image acquisition devices, where such modifications are associated with achieving a capture plan, such as shutter settings or resolution, or LIDAR device settings, etc., the systems and methods herein are configurable to generate such modifications in the image devices used to acquire images.

Still further, the systems and methods of the present disclosure can apply a summary rating to a capture plan, based on an analysis of a likelihood of that the capture plan will allow the capture plan goal to be met. Such a grade can provide a way to compare across image acquisition events. A summary metric can also provide a way to choose whether to accept or reject a set of acquired images from an image acquisition event based on this summary rating.

The systems and methods herein can be operated as pipeline of applications or they can be called independently. The system can be made available via an API. In the case of an API, the system can provide a callable endpoint for analysis of acquired images, which would be accepted as inputs goals, and scene or structure-related information. This can also include capture plan file (if available), image device file, resulting 3D representation, and the acquired images. In other cases, the system might incorporate only an acquired image file and information about the structure of interest and required quality of results, and, optionally, provide the results.

Still further, the system can be configured to characterize the capture plan based on past knowledge of capture plans, such as in case of unmanned aerial vehicle flights, orbit, grid, double orbit, boustrophedonic, etc. Relating of a new capture plan to a known capture plan can assist in effectively communicating the feedback to a user who is used to a specific output or interface.

The system can be configured to characterize or present the analysis and feedback herein based on past knowledge of autonomous software programs from other vendors, such as Drone Deploy®, Precision Mapper, etc. Such feedback could include specific settings to use in setting up autonomous flight software from such other vendors. Change over from another vendor may then be easier, which can be a benefit when a user is trained to use a specific type of software program from which effecting changeover may be difficult.

The system can be configured to interpret the scene contents and when necessary provide additional analysis around a structure of interest and in relation to the capture plan goal associated with an image acquisition event. In the case of inspection for solar estimation and installation, a goal for the image acquisition event could be to identify the height of any existing or potential occlusions on the structure that may affect solar use, including chimneys and trees.

A user typically wants to know that the images captured in an image acquisition event are sufficient to meet the objective of the capture plan goal before the imaging device is removed from the scene. Sometimes this requires premises access permission, or long travel distances, equipment rental, setup time, etc. to capture the images necessary of the scene and a structure of interest that are required to generate the desired results. If the user fails to generate an adequate image acquisition set while the imaging device is located on the scene, it may be at least expensive and time consuming if the image acquisition event does not yield the desired results. Moreover, if access cannot be obtained at the scene for a second time, the desired results may be impossible to obtain.

It is often not trivial to determine on location if the acquired images will support goals of the capture plan. For example, if the capture plan goal includes both measurements and inspection as the information types to be generated from an image acquisition event, each of which incorporate different information and generate different results, it may not be possible to determine whether both of these objectives have been met while onsite. In short, without first viewing the outputs of captured image processing (including reconstruction/structure from motion), one cannot know whether the acquired images will conform to the capture plan.

Moreover, if the acquired images are not processed until later when the unmanned aerial vehicle is away from the scene, and it is determined that the capture plan goal was not met, several problems can arise. For example, it can be difficult in the first order to analyze a capture plan after the fact. It can also be difficult to determine the reasons that poor 3D reconstruction of a structure was generated or low accuracy of measurements were returned. Further, it can be difficult to determine whether there is low accuracy in the results, without first performing an accuracy study. And, even if the resultant 3D reconstruction appears acceptable to a human eye, analysis of the 3D representation associated therewith can reveal that some areas were not captured sufficiently for accurate 3D representations of the structure of interest, if that is the capture plan goal for the image acquisition event. It can also be difficult to provide feedback to pilots or mobile users in a way to make it easy to design or fly a subsequent capture plan.

One prior art method provides a way to view image acquisition effectiveness. In this regard, Pix4D offers visualization of camera positions at each capture point. If the user selects a point on a point cloud, ray tracing can be obtained. This allows lines to be shown from the selected point to each camera, which provide information about from which camera the selected point was seen. This, in turn, generates information about what aspects of the images contributed to a 3D reconstruction of a structure of interest. However, the Pix4D method does not account for occlusion that may be present in acquired images. One could then infer that the confidence of accuracy of that point from the number of, and angles of, the cameras used to generate the images of the structure contribute to that point in 3D space. There are improvements needed in this prior art methodology at least because only image coverage is addressed therein, whereas occlusion is ignored totally. Errors can therefore be introduced in this prior art methodology because a camera might be shown as contributing to the selected point when the point cannot, in fact, be seen from that camera angle.

The systems and methods herein not only shows cameras for every point in the point cloud, but also limits the points shown to non-occluded cameras, bringing in SSD, formalized camera angle analysis, etc.

Yet further, the prior art provides only limited analysis of acquired images after processing to generate the output information about the structure etc. Such limited information includes, for example, presentation of cameras representations over the scene, rays specifying focus area of the camera, and images that stemmed from the camera. Data for this analysis is often captured in files provided that camera locations and EXIF data are stored in images. From such information prior art methods can link images to camera positions as a convenient way to zoom on a structure.

With regard specifically to unmanned aerial vehicle image acquisition, the systems and methods of the present disclosure can be used to improve capture plans used to acquire images for structures of interest etc. for unmanned aerial vehicles. Such flights can be manual, that is, conducted by an operator who directs the unmanned aerial vehicle navigation using a controller, user interface, or the like. The unmanned aerial vehicle can be flown autonomously using navigational instructions provided to the vehicle. In some cases, the unmanned aerial vehicle can be operated with a combination of manual and autonomous navigation.

Some issues that can be relevant to manual flights include:
Acquiring more images than necessary due to irregular patterns—longer flight, reconstruction, transfer times;
Poor centering of vehicle to building center on an orbital capture plan so as to generate point clouds that have holes or missing areas;
Speeding up/slowing down on turns—with timer-based capture logic, results in inconsistent camera placement, poor overlap on fast legs, too much overlap on slow legs;
Going too fast overall—poor forward overlap, blur issues, poor reconstruction;
Multiple flight grid heights—poor scaling; and
Too few legs on grid pattern, poor side overlap, poor reconstruction.

Some issues that can be relevant to autonomous flights can include;
Flying too high—poor GSD, too many images, long 3D reconstruction times;
Flying too low—low overlap or too many images for a good 3D reconstruction time;

Pattern Selection—choosing orbit with circles, when grid pattern a better fit for the structure and location;

Not flying 10-20% past the edge on a grid pattern so as to generate an incomplete point cloud; and Incorrect modification of defaults prior to flight prior to autonomous operation-speeds, grid overlaps, orbit radius.

The systems and methods have been described herein in detail with respect to the generation of information about structures of interest via vehicles incorporating imaging devices. However, the methods and systems herein can provide additional utility in generating useful information from images of a structure, object, item, person, animal, etc.

With respect to mobile device implementations, the systems and methods of the present disclosure can be represented by a real time capture feedback mobile app. These design details indicate for a mobile app but the concepts apply to other implementations. The capture plan goal in this scenario can be to capture imagery sufficient to achieve a good 3D reconstruction of the structure(s) of interest, from which other analysis and value can be provided.

Generally, at a base level, when a user is capturing a scene, he requires knowledge of whether the images or video captured will be sufficient to generate a good 3D reconstruction of the structure of interest. In an implementation, an app on a mobile device can provide instructions to guide a user to generate a high-quality capture so that software/algorithms can optimally reconstruct the scene when the information generated from the mobile device is suitably transferred therewith.

Technically, the app configured in a mobile device environment can be configured perform at least the following functions:

Analyze scene texture and ensure there is enough for image processing algorithms to work;

Sense camera movement as combination of rotational and translational movement; and Provide real time feedback to the user to provide guidance on speed, movement and contextual capture.

One implementation of a mobile device app can use the OpenCV library to analyze scene feature content of the video stream and provide basic indications of scene feature tracking quality. The mobile device app can be configured to capture Inertial Measurement Unit (IMU) data on each video frame and performs motion analysis.

Sample use cases for such a capture feedback mobile device app:

Flooring estimator uses mobile device to generate a floorplan for quoting by walking around a room while using the app. The estimator is notified: (1) if captured imagery is sufficient to generate complete plan; (2) with special instructions for moving around furniture; and (3) of potential issues with lack of scene texture;

Homeowner uses mobile device to scan the front of her house to measure windows for replacement. During the scanning, she receives information to provide guidance for moving in proper capture plan and the ability to indicate windows she cares about;

Industrial valve owner uses mobile device to scan entire valve to send specs to a valve maker for repair, replacement, etc.;

Designer uses mobile device to scan existing building exterior and interior, for input into a SketchUp or Revit model;

Homeowner uses mobile device to scan a kitchen for input into a virtual visualization and product selection engine to see how products would fit and appear in her home;

Roofer travels to a location and uses a mobile device to scan a roof manually or via unmanned aerial vehicle. Before leaving the site, she receives notification of proper or improper capture. The app can provide the ability to check unmanned aerial vehicle captured imagery or video.

Capture plan goals of the mobile device app can include:

Ensure that user conducts best possible capture;

Indicate predicted quality of output based on scene/capture;

Train user to capture videos that yield high-quality reconstructions; and

Integrate into a customer's or 3d party's mobile app to manage or direct the capture process.

Features that can be incorporated in the mobile app can include:

Visual cues for sufficient features, speed, and movement type;

Sense rotation-only movement, indicate issues with movement during image acquisition;

Optionally stop capture on pure rotation;

Visual cues to direct back to moment/frame of acceptable movement;

Begin seamless record again; and

Driven by scene-type specific capture plans.

Scene-types supported by the mobile device can include, for example:

Whole room interior capture;

360° walk-around capture of object (e.g., building or piece of equipment) that can fit in camera frame;

Floor sequential;

Façade of structure;

Façade plus roof of structure;

Whole structure exterior;

Whole structure exterior plus interior;

Capture of all motion data for back-end usage;

Confirm marker found in the scene;

Tutorial(s) to provide guidance to user—staged/produced;

Live guidance for user generated by real-time image/video analysis;

Accept user input on region of interest, type of capture;

Identify items in scene/frame and allow selection;

Confirm if scale marker found in the scene, accept specification of the marker; and Collect data for use in reconstruction—anything that can make process more efficient, higher quality, more repeatable, etc.

Additional features that can also be included with the mobile app:

Show live dimensions where marker is in the scene (e.g., live camera pose estimation);

User-selectable region of interest to focus capture;

Quality check around certain area(s); and

Quick analysis of acquired images or video to determine quality.

Such a mobile app that incorporates the captured image processing, capture plan analysis and improvements, and capture plan goal assessment can address at least the following technical challenges that exist currently:

Collect and analyze IMU data to determine their usefulness as input to motion estimation scheme;

Collect GPS data and determine their usefulness as input to motion estimation scheme;

Develop framework for combining video, GPS, and IMU data to track camera motion and produce either basic reconstruction or reconstruction quality estimate;

Track camera movement and detect rotation-only movement;

Determine best available movement data (e.g. GPS only occasionally available);

Develop app-accessible, server-based reconstruction quality predictor or basic reconstruction;

Determine how to find last good capture frame, to restart capture when back in view;

Sense/demarcate marker in live video or camera view;

Design/implement framework to interface with UI that provides feedback on condition of scene, movement, etc.; and Capture series of 15-second video captures of scenes that exemplify the types of movement, texture, etc. that would elicit feedback from the system. Goal is to use them to explain to UX team the concepts and for the UX team to illustrate on these videos the proposed feedback approach.

The user interface and user experience (UI/UX) supports:

Positive interactive experience to guide the user to an optimal capture;

Adapt experience based on data from framework (movement, scene quality);

Optimize user experience for
 display of features in real-time;
 positive and corrective movement cues;
 confirmation marker is captured;
 Series of 15-second video captures of scenes to explain approach;
 Select scene type dialogue;
 Scene-specific directives on movement; and Tutorials—optimized implementation so close at hand but non-intrusive.

Example scenario(s) for uses of the mobile device app:

Capture whole room—user has selected whole room scene;

User can watch video of example of whole room capture, indicating where to start, what direction to move, speed to move, example feedback, etc.;

User is directed to start in certain spot, starts capturing, and is provided with instructions regarding the direction and speed to move;

When system senses very low feature count, e.g., when focused on white wall, the system can provide instructions to direct user to high feature area (up to ceiling, down to floor, etc.) to better ensure continuity of reconstruction;

When system senses movement is too fast or too slow instructions suggestions for speed change can be provided; and When system senses pure rotation, it can provide instructions to direct user to stop doing it, to move back to position and area it was last capturing before pure rotation, and direct to start moving again.

Additional or alternative functionality that can be incorporated into the mobile app can be lightweight server-based Simultaneous Localization and Mapping (SLAM) to generate "Quick View". In this regard, one implementation can provide that there is no pure-rotation movement in captured video, whereas another implementation takes confirmation to next level by generating a "Quick View" of the captured scenes, using quick sparse model, for purpose of checking capture quality.

Post capture, the system can be configured to immediately or substantially down sample the video, send to server and perform SLAM, then deliver results back to client in a meaningful manner.

In the SLAM approach, it can be important to skip collection of (or not transmit) rotational movements so that SLAM will complete successfully.

Additional or alternative functionality can include:

Transfer of SLAM to the mobile device for real-time or substantially real-time capture quality and sparse scene building;

Optimizes SLAM to run near-real time on phone;

Integrates with existing directives and UI interface to maintain feedback mechanism; and Adds interpolated view in combination with camera pose view.

An expanded UI/UX can include:

Integrate with existing directives and UI interface to maintain feedback mechanism;

Show real time generation of camera pose view; and

Add interpolated view in combination with camera pose view.

Figure 2:
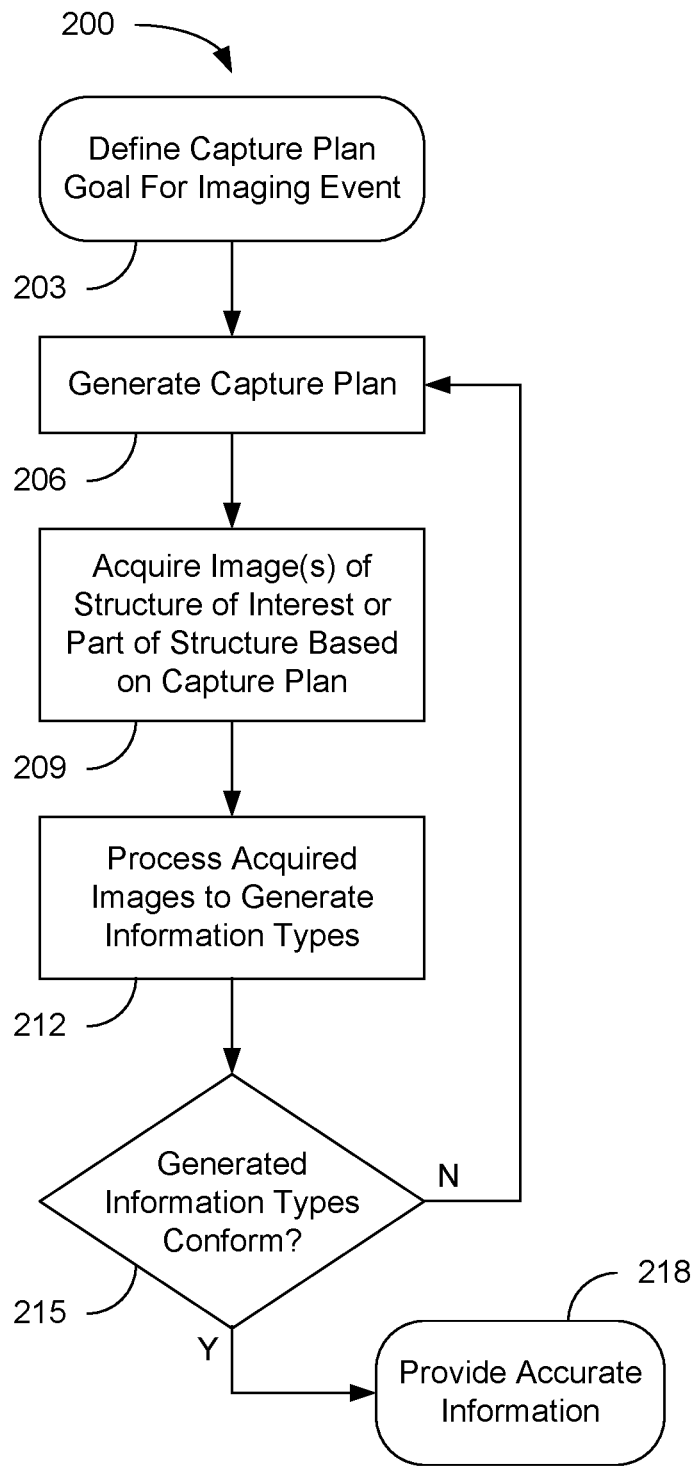
FIG. 2 illustrates an example of a process, in accordance with various aspects of the present disclosure.

Referring next to FIG. 2, shown is an example of a process 200 that can be used to generate information about structures of interest. Beginning at 203, a capture plan goal can be defined for an imaging event. The capture plan goal can be defined by a computer, a user or a combination thereof. The capture plan goal can be configured to provide one or more defined information type(s) about a structure of interest, or a part of a structure of interest. Information type(s) can be generated using one or more image capture device(s) of a user device or user devices such as, e.g., an unmanned aerial vehicle, mobile computing device, etc.

At 206, a capture plan can be generated in order to achieve the capture plan goal. The capture plan can be configured to substantially complete the capture plan goal. The capture plan can comprise instructions that are configured for operating of the user device(s) to implement and/or complete the capture plan. The instructions can be associated with operating the user device(s) and/or navigating the user device(s) to, around, and back from a location proximate to the structure of interest. The capture plan can be generated by the computer and/or the user.

Next, images of the structure or interest or the part of the structure of interest can be acquired by the image capture device(s) at 209. The images can be acquired by the user device(s) in a structure imaging event based on the generated capture plan. For example, an unmanned aerial vehicle can be controlled through, e.g., vehicle operation instructions, vehicle navigation instructions and/or image acquisition instructions to acquire a plurality of images during the structure imaging event. Similarly, operation instructions, navigation instructions and/or image acquisition instructions can be provided to acquire a plurality of images using other user device(s).

The acquired images can then be processed at 212 to generate information types about the structure of interest. The generated information types can comprise at least some of the defined information types defined by the capture plan goal. The defined information types can include a 3D representation comprising a 3D reconstruction or point cloud. The defined can also include measurements, counts, identification, orientation, materials or characterizations of the structure of interest or part of the structure of interest.

At 215, the generated information types can be compared to the defined information types to determine if they conform to the capture plan goal. If the generated information types satisfy the capture plan goal, then accurate information regarding the structure of interest can be provided at 218. If the generated information types are incomplete and thus do not conform, then the process flow can return to 206 to generate a subsequent capture plan to achieve the capture plan goal. For example, a second capture plan can be generated at 206. In some implementations, the structure of interest (or part of the structure of interest) can be same or different for different capture plans. Reconstructions generated from the imaging events can be compared with information associated with the real-life structure and/or with each other to provide accuracy information associated with the capture plans.

Figure 3:
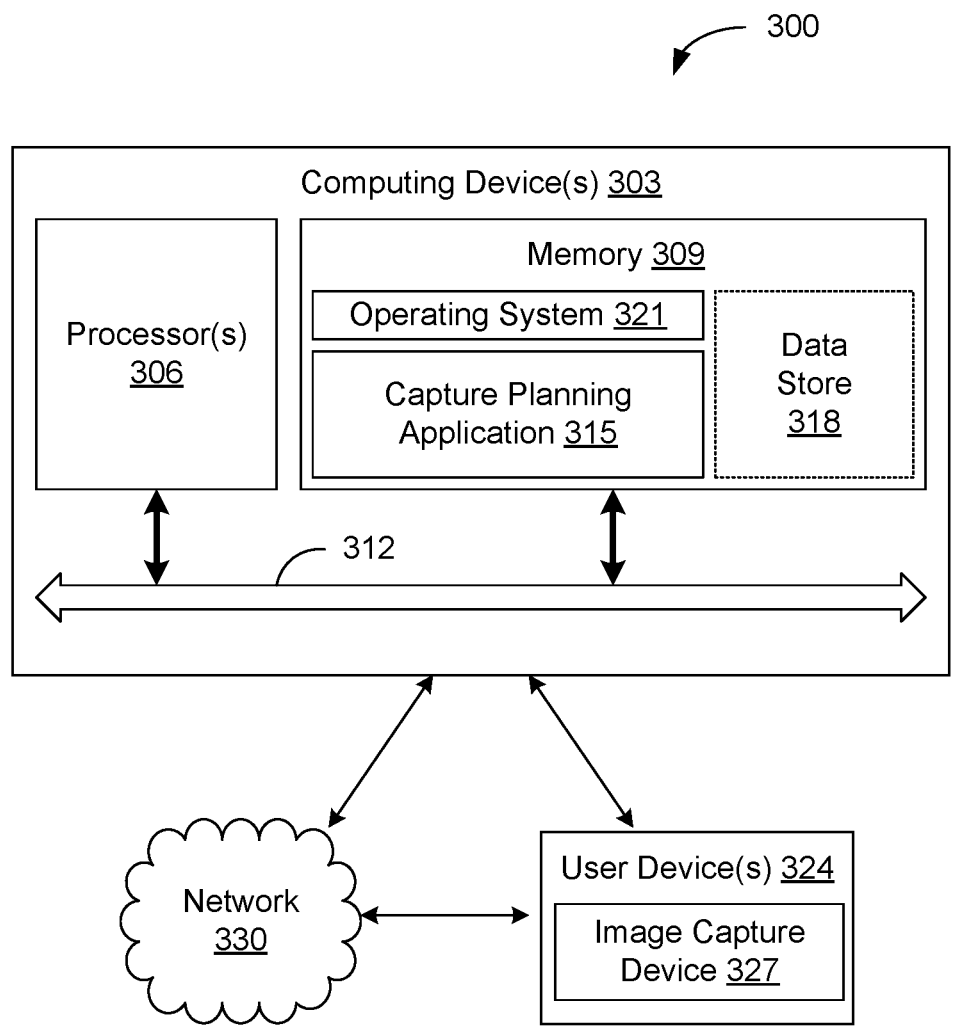
FIG. 3 is a block diagram illustrating an example of a machine that can be used for wireframe verification, in accordance with various aspects of the present disclosure.

Referring now to FIG. 3, shown is an example of a machine 300 that may be utilized for the capture planning methodology disclosed herein. The machine 300 can be a computing device 303 or other processing device, which includes at least one processor circuit, for example, having a processor 306 and a memory 309, both of which are coupled to a local interface 312. To this end, the computing device(s) 303 may comprise, for example, a server computer, mobile computing device (e.g., laptop, tablet, smart phone, etc.) or any other system providing computing capability. The computing device(s) 303 may include, for example, one or more display or touch screen devices and various peripheral devices. Even though the computing device 303 is referred to in the singular, it is understood that a plurality of computing devices 303 may be employed in the various arrangements as described above. The local interface 312 may comprise, for example, a data bus with an accompanying address/control bus or other bus structure as can be appreciated.

Stored in the memory 309 are both data and several components that are executable by the processor 306. In particular, stored in the memory 309 and executable by the processor 306 include a capture planning application 315 and potentially other applications. Also stored in the memory 309 may be a data store 318 and other data. The data stored in the data store 318, for example, is associated with the operation of the various applications and/or functional entities described below. For example, the data store may include databases, object libraries, and other data or information as can be understood. In addition, an operating system 321 may be stored in the memory 309 and executable by the processor 306. The data store 318 may be may be located in a single computing device or may be dispersed among many different devices. The components executed on the computing device 303 include, for example, the capture planning application 315 and other systems, applications, services, processes, engines, or functionality not discussed in detail herein. It is understood that there may be other applications that are stored in the memory 309 and are executable by the processor 306 as can be appreciated. Where any component discussed herein is implemented in the form of software, any one of a number of programming languages may be employed.

The machine 300 can be configured to communicate with one or more user device(s) 324 (e.g., an unmanned aerial vehicle, mobile computing device or other mobile user device) including an image capture device 327. For example, the user device(s) 324 can be communicatively coupled to the computing device(s) 303 either directly through a wireless communication link or other appropriate wired or wireless communication channel, or indirectly through a network 330 (e.g., WLAN, internet, cellular or other appropriate network or combination of networks). In this way, capture plan information, acquired image information or other information can be communicated between the computing device(s) 303 and user device(s) 324.

A number of software components are stored in the memory 309 and are executable by the processor 306. In this respect, the term "executable" means a program file that is in a form that can ultimately be run by the processor 306. Examples of executable programs may be, for example, a compiled program that can be translated into machine instructions in a format that can be loaded into a random access portion of the memory 309 and run by the processor 306, source code that may be expressed in proper format such as object code that is capable of being loaded into a random access portion of the memory 309 and executed by the processor 306, or source code that may be interpreted by another executable program to generate instructions in a random access portion of the memory 309 to be executed by the processor 306, etc. An executable program may be stored in any portion or component of the memory 309 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

Also, the processor 306 may represent multiple processors 306 and the memory 309 may represent multiple memories 309 that operate in parallel processing circuits, respectively. In such a case, the local interface 312 may be an appropriate network that facilitates communication between any two of the multiple processors 306, between any processor 306 and any of the memories 309, or between any two of the memories 309, etc. The local interface 312 may comprise additional systems designed to coordinate this communication, including, for example, performing load balancing. The processor 306 may be of electrical or of some other available construction.

Although the capture planning application 315, and other various systems described herein, may be embodied in software or instructions executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those skilled in the art and, consequently, are not described in detail herein.

Any logic or application described herein, including the capture planning application 315, that comprises software or instructions can be embodied in any non-transitory computer-readable medium for use by or in connection with an instruction execution system such as, for example, a processor 306 in a computer system or other system. In this sense, the logic may comprise, for example, statements including instructions and declarations that can be fetched from the computer-readable medium and executed by the instruction execution system. The flow diagram of FIG. 2 shows an example of the architecture, functionality, and operation of possible implementations of a capture planning application 315. In this regard, each block can represent a module, segment, or portion of code, which comprises one or more executable instructions for implementing the specified logical function(s). It should also be noted that in some alternative implementations, the functions noted in the blocks may occur out of the order noted in FIG. 2. For example, two blocks shown in succession in FIG. 2 may in fact be executed substantially concurrently or the blocks may sometimes be executed in a different or reverse order, depending upon the functionality involved. Alternate implementations are included within the scope of the preferred embodiment of the present disclosure in which functions may be executed out of order from that shown or discussed, including substantially concurrently or in reverse order, depending on the functionality involved, as would be understood by those reasonably skilled in the art of the present disclosure.

Communication media appropriate for use in or with the inventions of the present disclosure may be exemplified by computer-readable instructions, data structures, program modules, or other data stored on non-transient computer-readable media, and may include any information-delivery media. The instructions and data structures stored on the non-transient computer-readable media may be transmitted as a modulated data signal to the computer or server on which the computer-implemented methods of the present disclosure are executed. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term "computer-readable media" as used herein may include both local non-transient storage media and remote non-transient storage media connected to the information processors using communication media such as the internet. Non-transient computer-readable media do not include mere signals or modulated carrier waves, but include the storage media that form the source for such signals.

In the context of the present disclosure, a "computer-readable medium" can be any medium that can contain, store, or maintain the logic or application described herein for use by or in connection with the instruction execution system. The computer-readable medium can comprise any one of many physical media such as, for example, electronic, magnetic, optical, electromagnetic, infrared, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

At this time, there is little distinction left between hardware and software implementations of aspects of systems; the use of hardware or software is generally (but not always, in that in certain contexts the choice between hardware and software can become significant) a design choice representing cost vs. efficiency tradeoffs. There are various information-processing vehicles by which processes and/or systems and/or other technologies described herein may be implemented, e.g., hardware, software, and/or firmware, and that the preferred vehicle may vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various aspects of the devices and/or processes for system configuration via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the aspects disclosed herein, in whole or in part, can be equivalently implemented in integrated circuits, as one or more computer programs running on one or more computers, e.g., as one or more programs running on one or more computer systems, as one or more programs running on one or more processors, e.g., as one or more programs running on one or more microprocessors, as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal-bearing medium include, but are not limited to, the following: a recordable type medium such as a floppy disk, a hard disk drive, a CD, a DVD, a digital tape, a computer memory, etc.; and a remote non-transitory storage medium accessed using a transmission type medium such as a digital and/or an analog communication medium (e.g., a fiber optic cable, a waveguide, a wired communications link, a wireless communication link, etc.), for example a server accessed via the internet.

Those skilled in the art will recognize that it is common within the art to describe devices and/or processes in the fashion set forth herein, and thereafter use engineering practices to integrate such described devices and/or processes into data-processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors, e.g., feedback for sensing position and/or velocity; control motors for moving and/or adjusting components and/or quantities. A typical data processing system may be implemented utilizing any suitable commercially available components, such as those typically found in data computing/communication and/or network computing/communication systems.

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

As described herein, the exemplary aspects have been described and illustrated in the drawings and the specification. The exemplary aspects were chosen and described in order to explain certain principles of the invention and their practical application, to thereby enable others skilled in the art to make and utilize various exemplary aspects of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A method of generating a collection of information for a structure of interest in a scene comprising:
   a. providing, by a user, a computer or an unmanned aerial vehicle (UAV), a capture plan configured to generate information associated with a structure of interest in a scene in a first image capture event, wherein the capture plan is associated with one or more capture plan goals;
   b. generating, by the computer or the UAV, capture plan instructions for operation of the UAV in the first image capture event, wherein the capture plan instructions comprise each of:
      i. instructions for navigating the UAV proximate to the structure of interest; and
      ii. instructions for acquiring a plurality of images of the structure of interest;
   c. executing, by the computer or the UAV, the capture plan instructions, thereby acquiring the plurality of images of the structure of interest and associated UAV operation information;
   d. processing, by the computer or the UAV, the plurality of acquired images and the associated UAV operation information in real time or substantially in real time during the first image capture event;
   e. generating, by the computer or the UAV, information for incorporation in a first collection of information in real time or substantially in real time during the first image capture event, wherein the information for incorporation comprises:
      i. structure information including some of:
         1. structure dimensions;
         2. 3D structure information;
         3. structure occlusions; and
         4. structure coverage;
      ii. acquired image characteristics including an amount of overlap between images; and
      iii. UAV performance information;
   f. comparing, by the computer or the UAV, the information incorporated in the first collection of information with the one or more capture plan goals in real time or substantially in real time during the first image capture event; and
   g. determining, by the computer or the UAV, in real time or substantially in real time during the first image capture event whether the structure information incorporated in the first collection of information will substantially meet the one or more capture plan goals at a completion of the first image capture event.

2. The method of claim 1 further comprising:
   a. generating, by the computer or the UAV, modified capture plan instructions for operation of the UAV in the first image capture event when the information incorporated in the first collection of information is determined to not substantially meet at least one goal of the one or more capture plan goals at the completion of the first image capture event, wherein the modified capture plan instructions are generated in real time or substantially in real time during the first image capture event and comprise each of:
      i. instructions for navigating the UAV proximate to the structure of interest; and
      ii. instructions for acquiring additional images of the structure of interest that provide additional structure information for incorporation in the first collection of information;
   b. executing, by the computer or the UAV, the modified capture plan instructions in real time or substantially in real time during the first image capture event, thereby acquiring the additional images of the structure of interest and additional associated UAV operation information;
   c. processing, by the computer or the UAV, the acquired additional images and the additional associated UAV operation information generated during the first image capture event; and
   d. generating, by the computer or the UAV, additional information for incorporation in the first collection of information, wherein the additional information comprises:
      i. structure information including some of:
         1. structure dimensions;
         2. 3D structure information;
         3. structure occlusions; and 4. structure coverage;
  ii. acquired image characteristics including the amount of overlap between images; and
  iii. UAV performance information.
3. The method of claim 1, wherein the structure information is generated as a 3D reconstruction of the structure of interest and is in a form of:
  a. a wireframe or CAD drawing;
  b. a point cloud or mesh; or
  c. an orthomosaic image.
4. The method of claim 3, wherein the 3D structure information includes camera positions and EXIF data derived from the processing of the plurality of images and the associated UAV operation information.
5. The method of claim 1, wherein the capture plan instructions are associated with known structure information about the structure of interest known prior to acquisition of the plurality of images, and wherein the known structure information comprises some or all of:
  a. estimated dimensions of all or part of the structure of interest;
  b. estimated outer boundaries of all or part of the structure of interest;
  c. GPS location of the structure of interest;
  d. estimated height of the structure of interest;
  e. estimated outer boundaries of the structure of interest; or
  f. obstacles proximate to the structure of interest.
6. The method of claim 1, wherein the capture plan instructions are configured with UAV information comprising some or all of:
  a. sensor resolution for the one or more image capture devices on the UAV;
  b. UAV battery life;
  c. UAV inertial measurement sensors and associated componentry;
  d. UAV GPS status or GPS interference during image acquisition;
  e. altitude of the UAV during image acquisition;
  f. UAV clock data; or
  g. weather data during image acquisition.
7. The method of claim 1, wherein the capture plan instructions are associated with image acquisition information for some or all of:
  a. number of images to be acquired during the first structure imaging event;
  b. number of images to be acquired per unit time during the first structure imaging event;
  c. number of images to be acquired per unit of distance traveled by the unmanned aerial vehicle during the first structure imaging event;
  d. distances between the UAV and all or part of the structure of interest during image acquisition;
  e. view angle derivable from an acquired image of the structure of interest or structure part and a corresponding surface or surface part;
  f. angle of triangulation derivable from each of two points in two images of the same structure of interest or structure part;
  g. structure sample distance ("SSD") between the unmanned aerial vehicle and the structure of interest or structure part during image acquisition;
  h. ground sample distance ("GSD") between the unmanned aerial vehicle and the structure of interest or structure part during image acquisition;
  i. speed at which the UAV is instructed to move in the scene or environment during image acquisition; or
  j. number of passes to be made by the UAV in and around the structure of interest or parts of the structure of interest during image acquisition.
8. The method of claim 1, wherein the first collection of information comprises the structure information and includes some or all of:
  a. measurements for all or part of the structure of interest;
  b. 3D structure information;
  c. condition state information of any surface or part of the structure of interest;
  d. identification of structure type;
  e. identification of one or more parts on the structure of interest;
  f. topology of parts on the structure of interest; or
  g. identification of one or more surface defects on the structure of interest.
9. The method of claim 1, wherein the first collection of information comprises the structure information and the method further comprises:
  a. comparing, by the computer or the UAV, the structure information in the first collection of information with structure information in a second collection of information for that same structure of interest generated in a second image capture event conducted at a different time than the first image capture event; and
  b. identifying, by the user, the computer or the UAV, one or more changes in the structure of interest derivable from the first collection of information and the second collection of information.
10. The method of claim 1, wherein the first collection of information is provided with information indicating a qualitative or quantitative accuracy of the information.
11. The method of claim 1, further comprising transmitting, by the computer or the UAV, UAV navigation information and acquired image information to a user device during operation of the UAV during the first image capture event, thereby allowing a human operator to monitor and, optionally, to control operation of UAV navigation and image acquisition during the first image capture event.
12. A non-transitory computer-readable medium embodying at least one program executable in at least one computing device, an unmanned aerial vehicle (UAV), or a combination thereof, the at least one program, when executed by the at least one computing device, the UAV, or combination thereof being configured to cause the at least one computing device, the UAV, or combination thereof to at least:
  a. generate capture plan instructions for operation of the UAV in a first image capture event, the capture plan instructions based at least in part upon a capture plan configured to generate information associated with a structure of interest in a scene, wherein the capture plan is associated with one or more capture plan goals and the capture plan instructions comprise each of:
    i. instructions for navigating the UAV proximate to the structure of interest; and
    ii. instructions for acquiring a plurality of images of the structure of interest;
  b. execute the capture plan instructions, thereby acquiring the plurality of images of the structure of interest and associated UAV operation information;
  c. process the plurality of acquired images and the associated UAV operation information in real time or substantially in real time during the first image capture event;
  d. generate information for incorporation in a first collection of information in real time or substantially in real time during the first image capture event, wherein the information for incorporation comprises:
  i. structure information including some of:
    1. structure dimensions;
    2. 3D structure information;
    3. structure occlusions; and
    4. structure coverage;
  ii. acquired image characteristics including an amount of overlap between images; and
  iii. UAV performance information;
 e. compare the information incorporated in the first collection of information with the one or more capture plan goals in real time or substantially in real time during the first image capture event; and
 f. determine in real time or substantially in real time during the first image capture event whether the structure information incorporated in the first collection of information will substantially meet the one or more capture plan goals at a completion of the first image capture event.

13. The non-transitory computer-readable medium of claim 12, wherein when executed the at least one program further causes the at least one computing device, the UAV, or combination thereof to at least:
 a. generate modified capture plan instructions for operation of the UAV in the first image capture event when the information incorporated in the first collection of information is determined to not substantially meet at least one goal of the one or more capture plan goals at the completion of the first image capture event, wherein the modified capture plan instructions are generated in real time or substantially in real time during the first image capture event and comprise each of:
  i. instructions for navigating the UAV proximate to the structure of interest; and
  ii. instructions for acquiring additional images of the structure of interest that provide additional structure information for incorporation in the first collection of information;
 b. execute the modified capture plan instructions in real time or substantially in real time during the first image capture event, thereby acquiring the additional images of the structure of interest and additional associated UAV operation information;
 c. process the acquired additional images and the additional associated UAV operation information generated during the first image capture event; and
 d. generate additional information for incorporation in the first collection of information, wherein the additional information comprises:
  i. structure information including some of:
    1. structure dimensions;
    2. 3D structure information;
    3. structure occlusions; and
    4. structure coverage;
  ii. acquired image characteristics including the amount of overlap between images; and
  iii. UAV performance information.

14. The non-transitory computer-readable medium of claim 12, wherein the structure information is generated as a 3D reconstruction of the structure of interest and is in a form of:
 a. a wireframe or CAD drawing;
 b. a point cloud or mesh; or
 c. an orthomosaic image.

15. The non-transitory computer-readable medium of claim 14, wherein the 3D structure information includes camera positions and EXIF data derived from the processing of the plurality of images and the associated UAV operation information.

16. The non-transitory computer-readable medium of claim 12, wherein the capture plan instructions are associated with known structure information about the structure of interest known prior to acquisition of the plurality of images, and wherein the known structure information comprises some or all of:
 a. estimated dimensions of all or part of the structure of interest;
 b. estimated outer boundaries of all or part of the structure of interest;
 c. GPS location of the structure of interest;
 d. estimated height of the structure of interest;
 e. estimated outer boundaries of the structure of interest; or
 f. obstacles proximate to the structure of interest.

17. The non-transitory computer-readable medium of claim 12, wherein the capture plan instructions are configured with UAV information comprising some or all of:
 a. sensor resolution for the one or more image capture devices on the UAV;
 b. UAV battery life;
 c. UAV inertial measurement sensors and associated componentry;
 d. UAV GPS status or GPS interference during image acquisition;
 e. altitude of the UAV during image acquisition;
 f. UAV clock data; or
 g. weather data during image acquisition.

18. The non-transitory computer-readable medium of claim 12, wherein the capture plan instructions are associated with image acquisition information for some or all of:
 a. number of images to be acquired during the first structure imaging event;
 b. number of images to be acquired per unit time during the first structure imaging event;
 c. number of images to be acquired per unit of distance traveled by the unmanned aerial vehicle during the first structure imaging event;
 d. distances between the UAV and all or part of the structure of interest during image acquisition;
 e. view angle derivable from an acquired image of the structure of interest or structure part and a corresponding surface or surface part;
 f. angle of triangulation derivable from each of two points in two images of the same structure of interest or structure part;
 g. structure sample distance ("SSD") between the unmanned aerial vehicle and the structure of interest or structure part during image acquisition;
 h. ground sample distance ("GSD") between the unmanned aerial vehicle and the structure of interest or structure part during image acquisition;
 i. speed at which the UAV is instructed to move in the scene or environment during image acquisition; or
 j. number of passes to be made by the UAV in and around the structure of interest or parts of the structure of interest during image acquisition.

19. The non-transitory computer-readable medium of claim 12, wherein the first collection of information comprises the structure information and includes some or all of:
 a. measurements for all or part of the structure of interest;
 b. 3D structure information;
 c. condition state information of any surface or part of the structure of interest;

d. identification of structure type;

e. identification of one or more parts on the structure of interest;

f. topology of parts on the structure of interest; or g. identification of one or more surface defects on the structure of interest.

20. The non-transitory computer-readable medium of claim 12, wherein the first collection of information comprises the structure information and when executed the at least one program further causes the at least one computing device, the UAV, or combination thereof to at least:

a. compare the structure information in the first collection of information with structure information in a second collection of information for that same structure of interest generated in a second image capture event conducted at a different time than the first image capture event; and b. identify one or more changes in the structure of interest derivable from the first collection of information and the second collection of information.

21. The non-transitory computer-readable medium of claim 12, wherein the first collection of information is provided with information indicating a qualitative or quantitative accuracy of the information.

22. The non-transitory computer-readable medium of claim 12, wherein when executed the at least one program further causes the at least one computing device, the at one UAV, or combination thereof to at least transmit UAV navigation information and acquired image information to a user device during operation of the UAV during the first image capture event, thereby allowing a human operator to monitor and, optionally, to control operation of UAV navigation and image acquisition during the first image capture event.

\* \* \* \* \*